United States Patent [19]
Dennison

[11] Patent Number: 5,206,183
[45] Date of Patent: Apr. 27, 1993

[54] METHOD OF FORMING A BIT LINE OVER CAPACITOR ARRAY OF MEMORY CELLS

[75] Inventor: Charles Dennison, Boise, Id.

[73] Assignee: Micron Technology, Inc., Boise, Id.

[21] Appl. No.: 838,537

[22] Filed: Feb. 19, 1992

[51] Int. Cl.$^5$ .................... H01L 21/265; H01L 21/70
[52] U.S. Cl. ........................... 437/47; 437/52; 437/60; 437/228
[58] Field of Search ............ 437/47, 52, 60, 919, 437/228; 257/296–313; 165/643; 365/149, 185

[56] References Cited

U.S. PATENT DOCUMENTS 5,061,650 10/1991 Dennison et al. .................. 437/47
5,138,412 8/1992 Hieda et al. ........................ 257/296

FOREIGN PATENT DOCUMENTS 3-174765 7/1991 Japan ................................. 437/52

*Primary Examiner*—Olik Chaudhuri
*Assistant Examiner*—Loc Q. Trinh
*Attorney, Agent, or Firm*—Wells, St. John, Roberts, Gregory & Matkin

[57] ABSTRACT

A method of forming a bit line over capacitor array of memory cells includes providing a first layer of polyimide over word lines. Such layer is then patterned and etched to define storage node circuits. A first layer of conductively doped polysilicon is applied over the first layer of polyimide. A second layer of polyimide is applied over the first layer of conductively doped polysilicon. The second layer of polyimide and first layer of polysilicon are etched over the first layer of polyimide to define isolated cell storage nodes. Such can be conducted without any prior patterning or masking of the second layer of polyimide and first layer of polysilicon. A third layer of polyimide is provided atop the wafer over the isolated cell storage nodes. The third and first layers of polyimide are etched to define bit line contacts. Insulating spacers are provided about the periphery within the bit line contacts. Conductive material is deposited to provide conductive material pillars within the bit line contacts. Remaining portions of the first, second and third layers of polyimide are etched from the wafer. A capacitor cell dielectric layer is provided atop the individual storage nodes. A capacitor cell polysilicon layer is provided atop the capacitor cell dielectric layer to define an array of memory cell capacitors. An insulating layer is provided atop the cell polysilicon later. An array of digit lines are provided atop the wafer which electrically connect with the conductive material pillars elevationally above the cell capacitors.

31 Claims, 21 Drawing Sheets

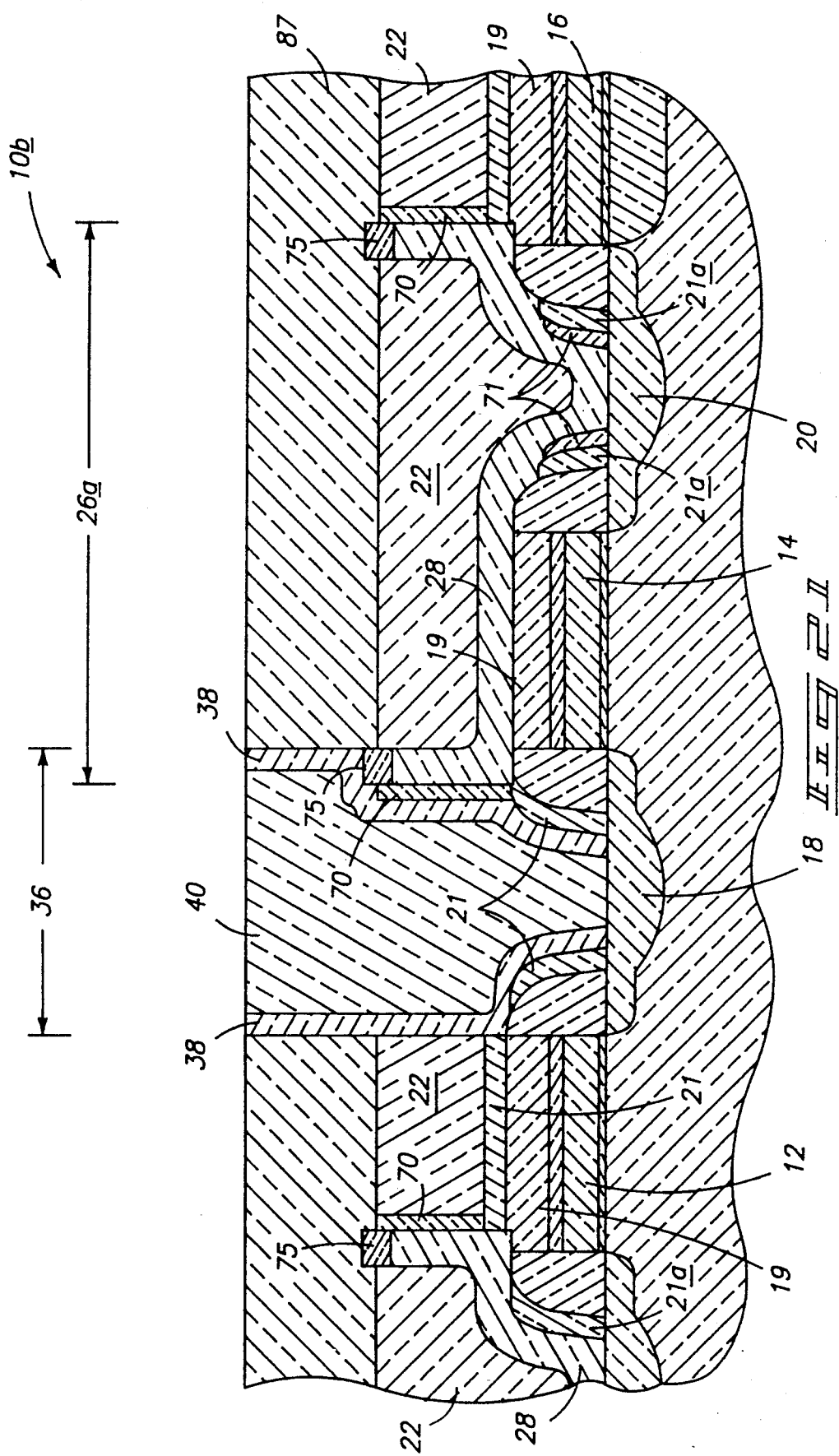

METHOD OF FORMING A BIT LINE OVER CAPACITOR ARRAY OF MEMORY CELLS

TECHNICAL FIELD

This invention relates generally to formation of a bit line over capacitor array of memory cells.

BACKGROUND OF THE INVENTION

Conventional stacked capacitor DRAW arrays utilize either a buried bit line or a non-buried bit line construction. With buried bit line constructions, bit lines are provided in close proximity to the bit line contacts of the memory cell FETs, with the cell capacitors being formed horizontally over the top of both of the word lines and bit lines. With non-buried bit line constructions, deep vertical contacts are made through a thick insulating layer to the cell FETs, with the capacitor constructions being provided over the word lines and beneath the bit lines. Such non-buried bit line constructions can also be referred to as capacitor-under-bit line or bit line-over-capacitor constructions.

With respect to bit line-over-capacitor constructions, the storage node polysilicon of the capacitor is not as large as it could otherwise be as one must provide room for the vertical contacts down to the cell FETs. Additionally, there are at least three potential areas of misalignment in bit line-over-capacitor constructions. A first is with respect to patterning and etch of the storage node poly. A second is with respect to etch of the cell poly. A third is with respect to bit line contact formation. Because of process design rules implemented to ensure a high proportion of operable chips, it is necessary to reduce the size of the storage node poly and increase the area for bit line contacts to allow for inevitable photomask misalignment. However such consumes space on the wafer, and correspondingly adversely impacts cell density.

Such are not predominate factors with buried bit line fabrication. However with buried bit lines, there are other areas of increased process complexity resulting from added photomask and etching steps. Also, buried bit line constructions require additional deposition steps beyond bit line-over-capacitor constructions.

It would be desirable to minimize or overcome these and other aspects associated with prior art bit line-over-capacitor arrays.

BRIEF DESCRIPTION OF THE DRAWINGS

One or more preferred embodiments of the invention are illustrated in the following accompanying drawings.

Figure 1:
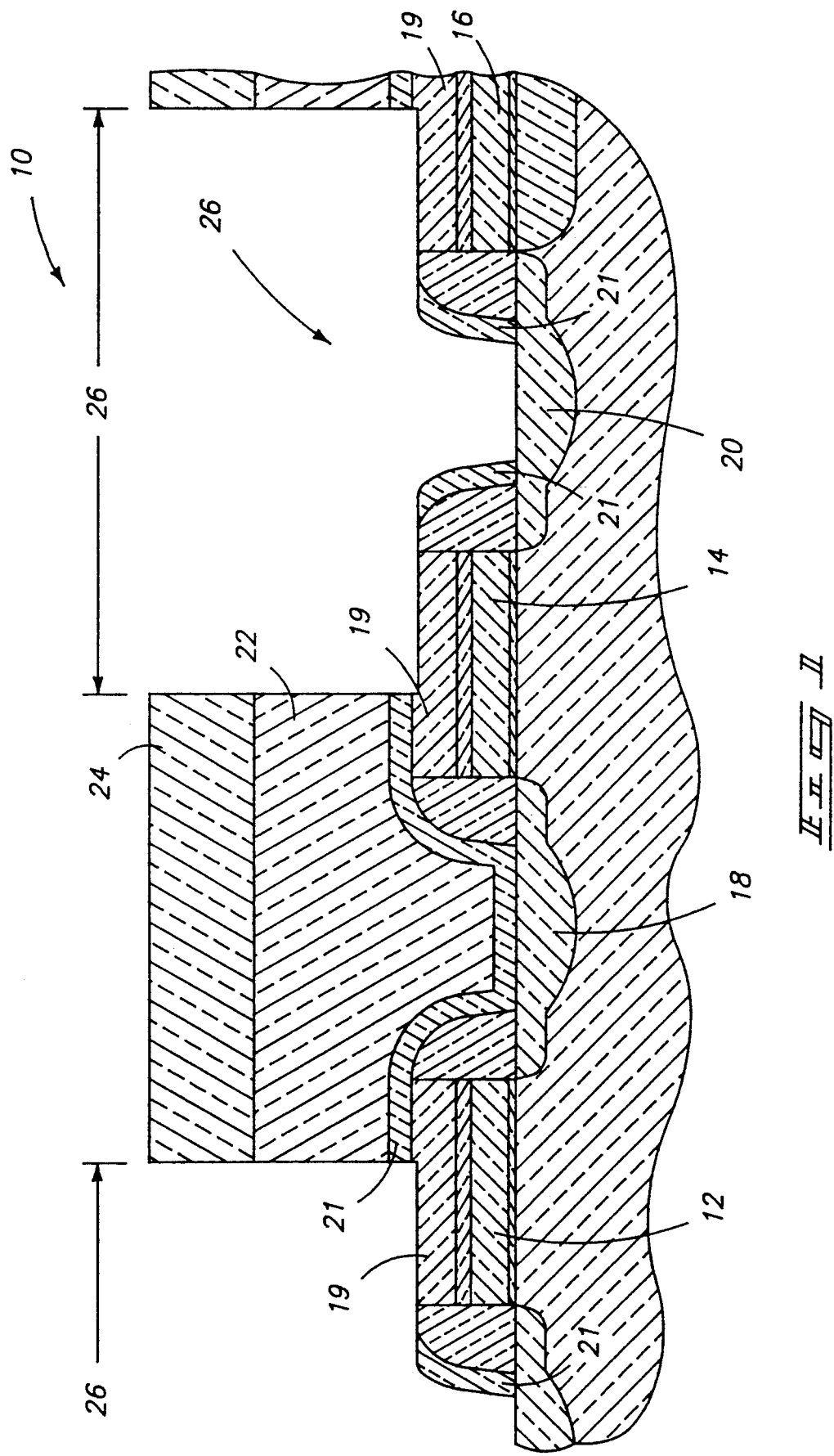
FIG. 1 is a diagrammatic section of a semiconductor wafer shown at one processing step in accordance with the invention.
Figure 7:
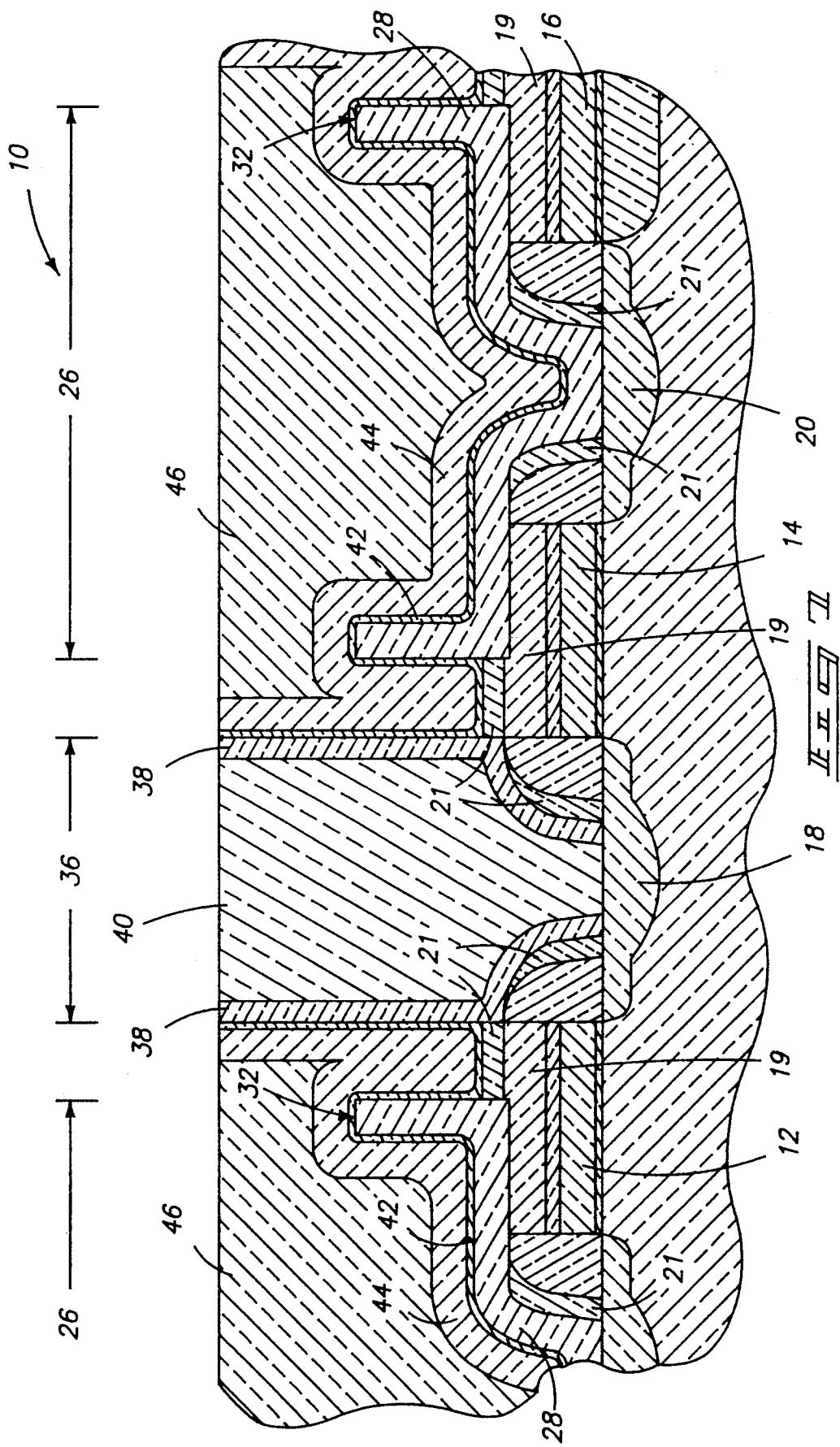
FIG. 7 is a diagrammatic section of the FIG. 1 wafer illustrated at a processing step subsequent to that shown by FIG. 6.

FIG, 8 is a diagrammatic section of the FIG. 1 wafer illustrated at a processing step subsequent to that shown by FIG. 7.

Figure 8:
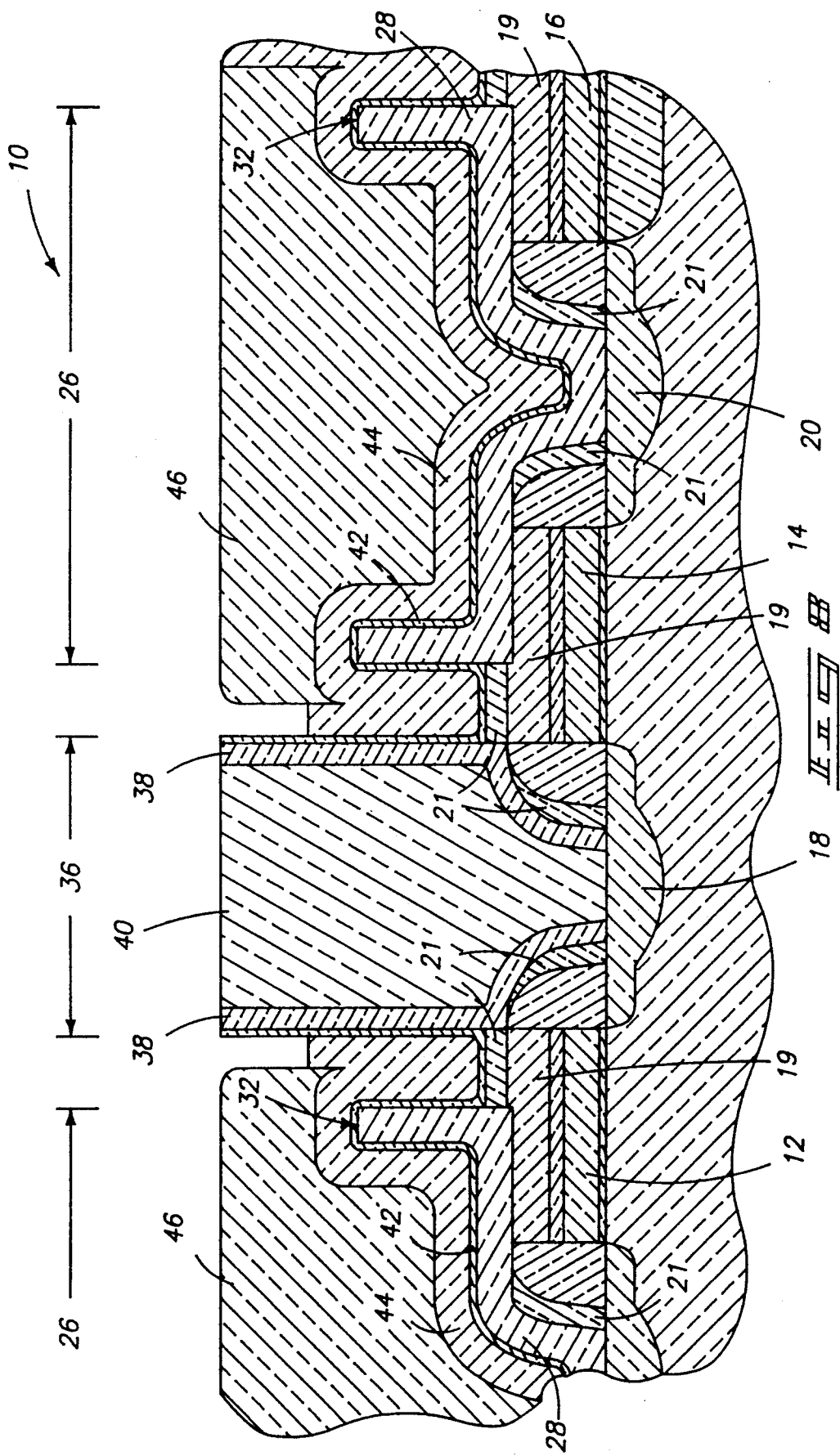
Figure 9:
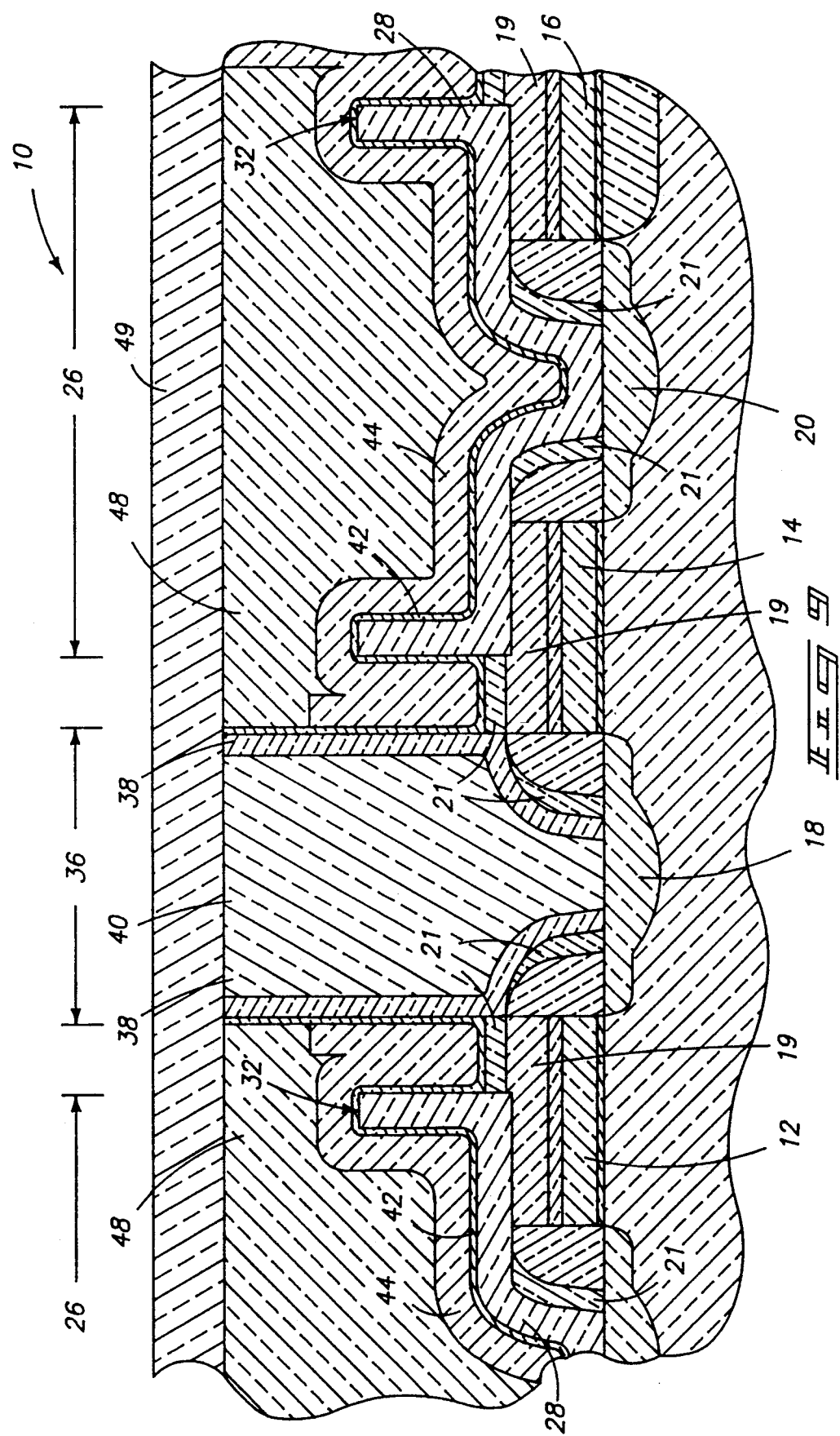

FIG.9 is a diagrammatic section of the FIG. 1 wafer illustrated at a processing step subsequent to that shown by FIG. 8.

Figure 10:
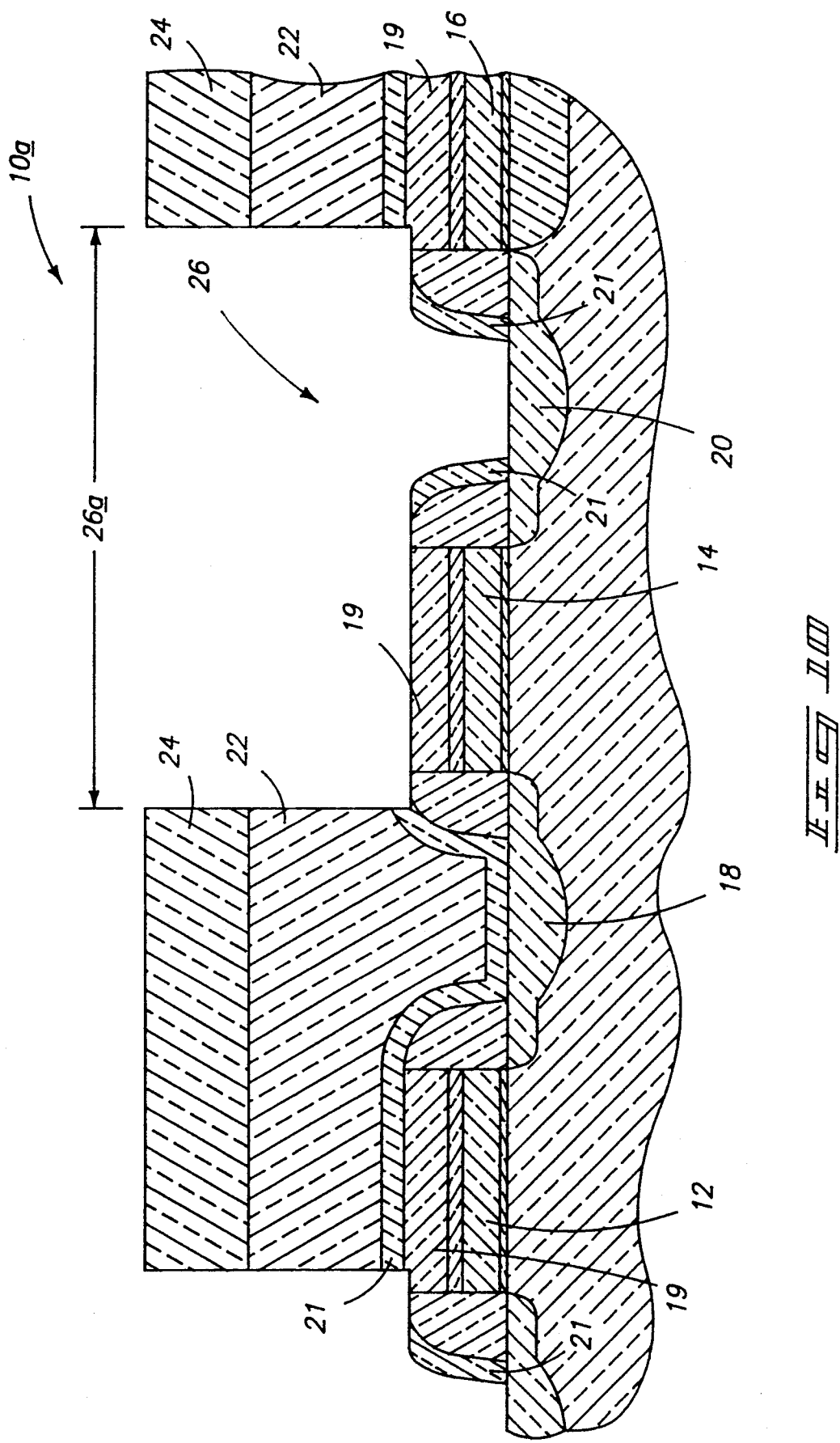

FIG. 10 is a diagrammatic section of a semiconductor wafer processed in accordance with other aspects of the invention.

Figure 11:
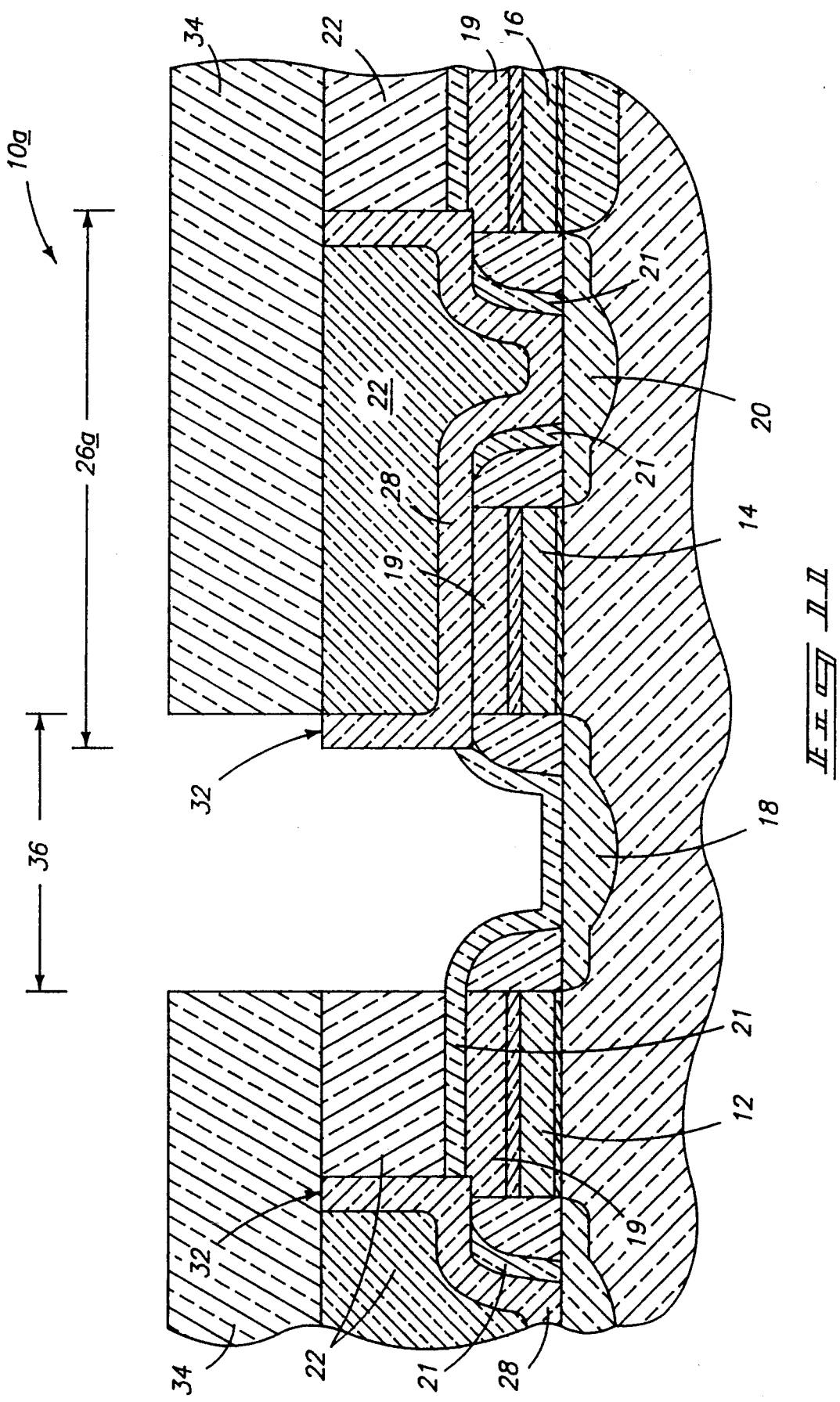

FIG. 11 is a diagrammatic section of the FIG. 10 wafer illustrated at a processing step subsequent to that shown by FIG. 10.

Figure 12:
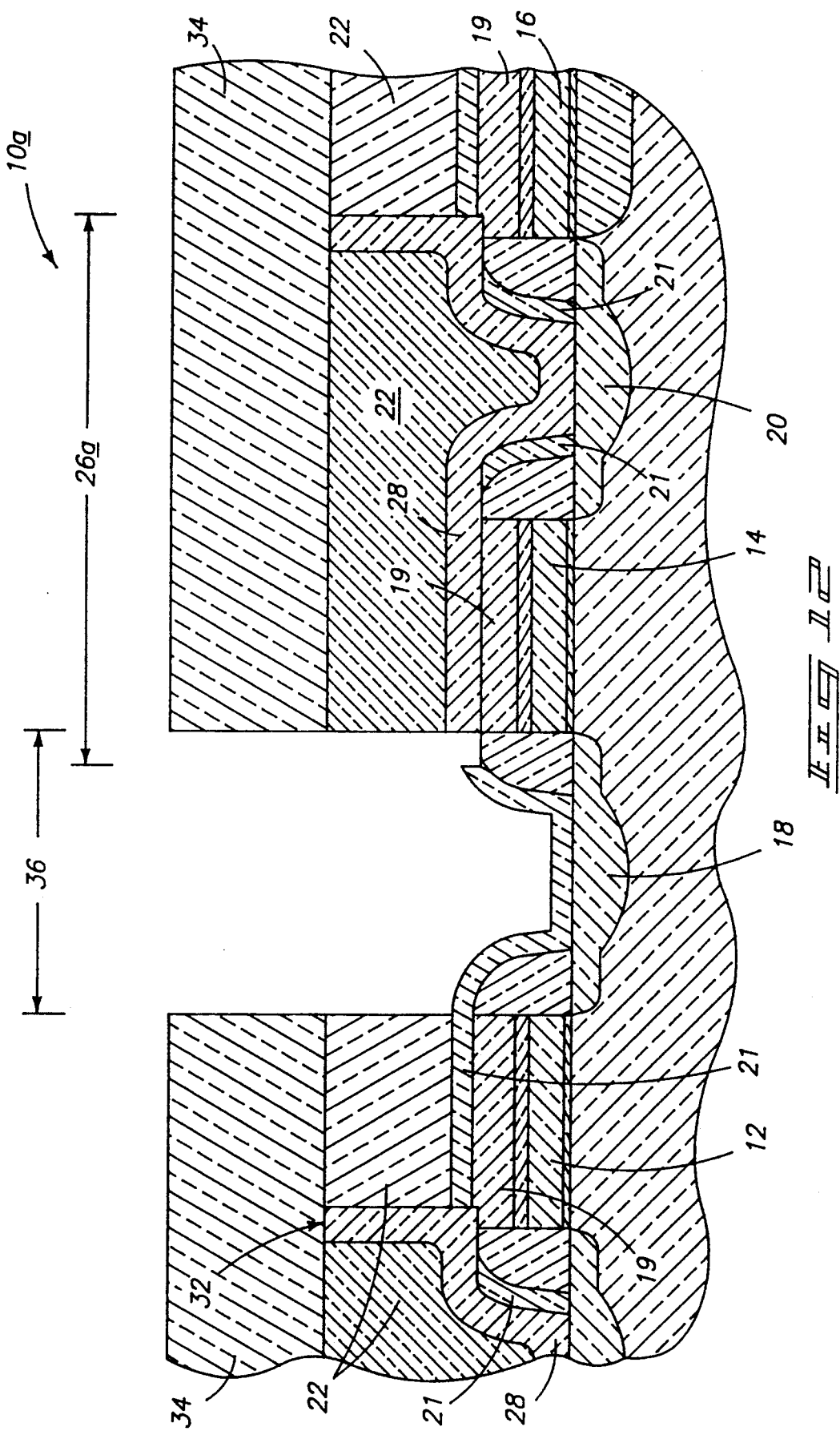

FIG. 12 is a diagrammatic section of the FIG. 10 wafer illustrated at a processing step subsequent to that shown by FIG. 11.

Figure 13:
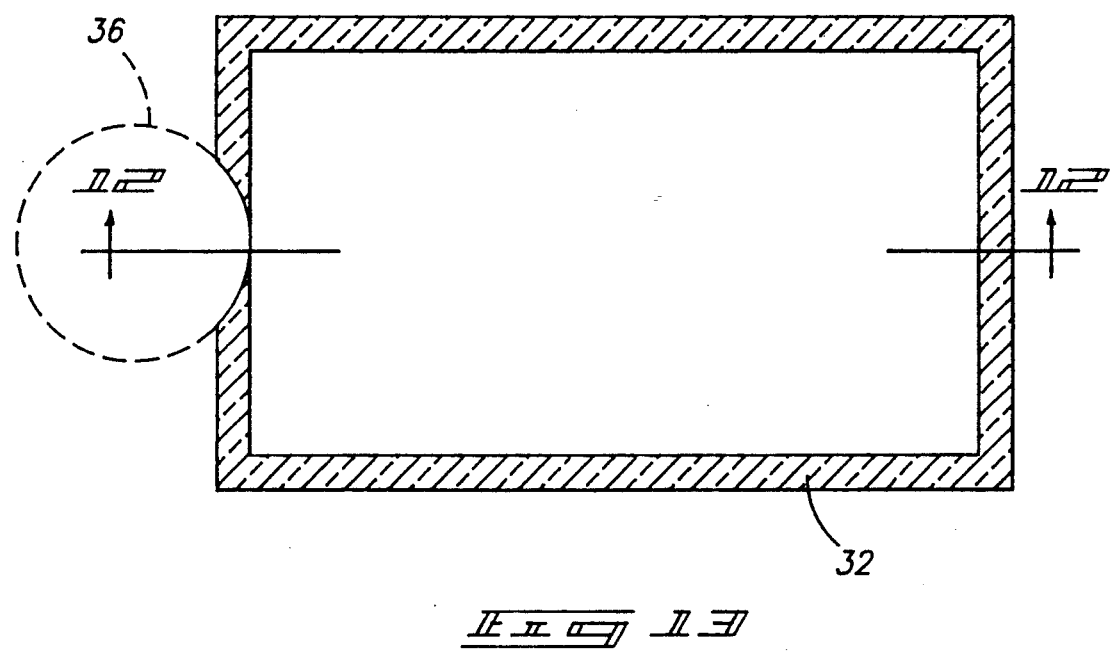

FIG. 13 is a diagrammatic top view of the FIG. 10 wafer illustrated at the processing step of FIG. 12.

Figure 14:
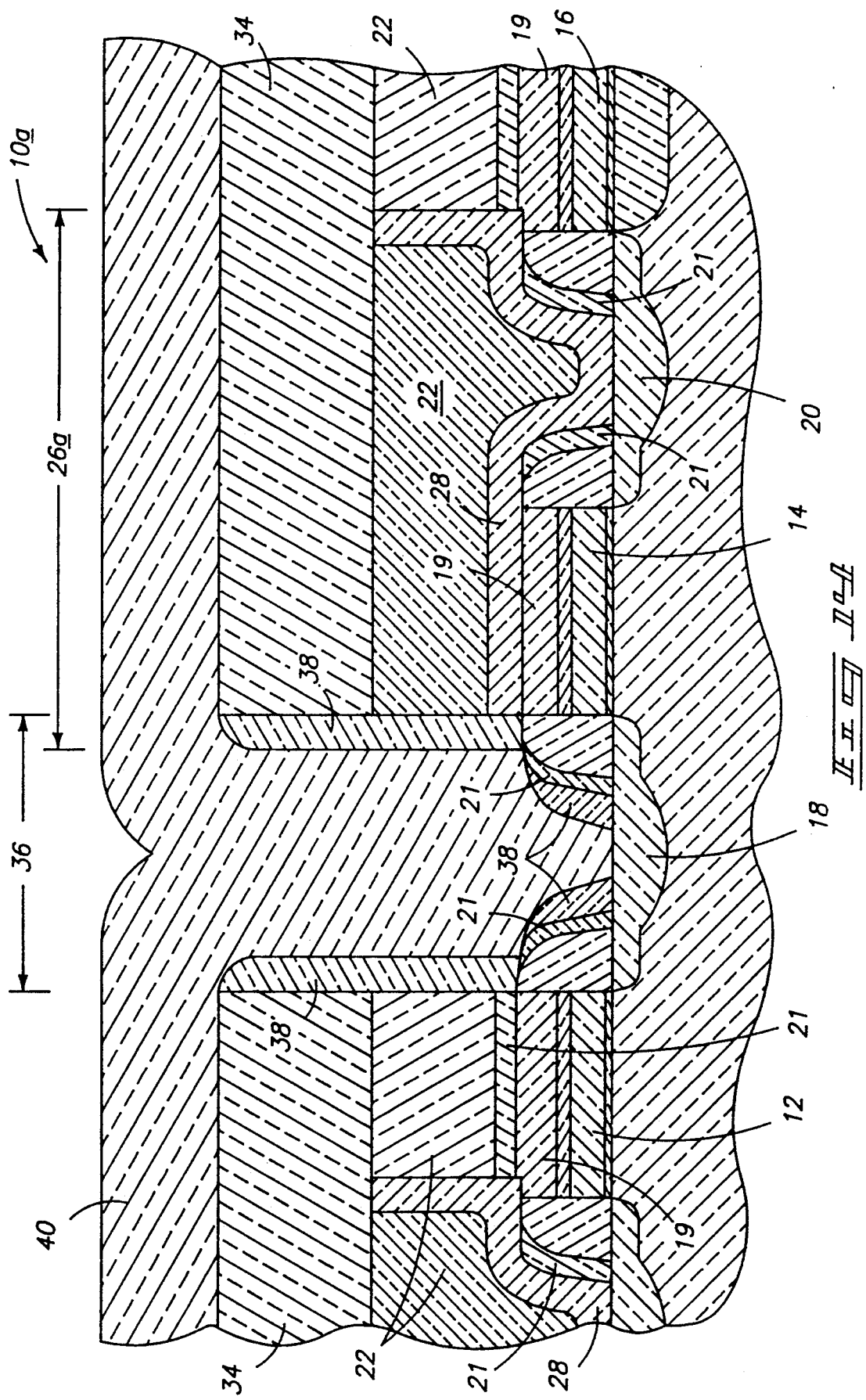

FIG. 14 is a diagrammatic section of the FIG. 10 wafer illustrated at a processing step subsequent to that shown by FIGS. 12 and 13.

Figure 15:
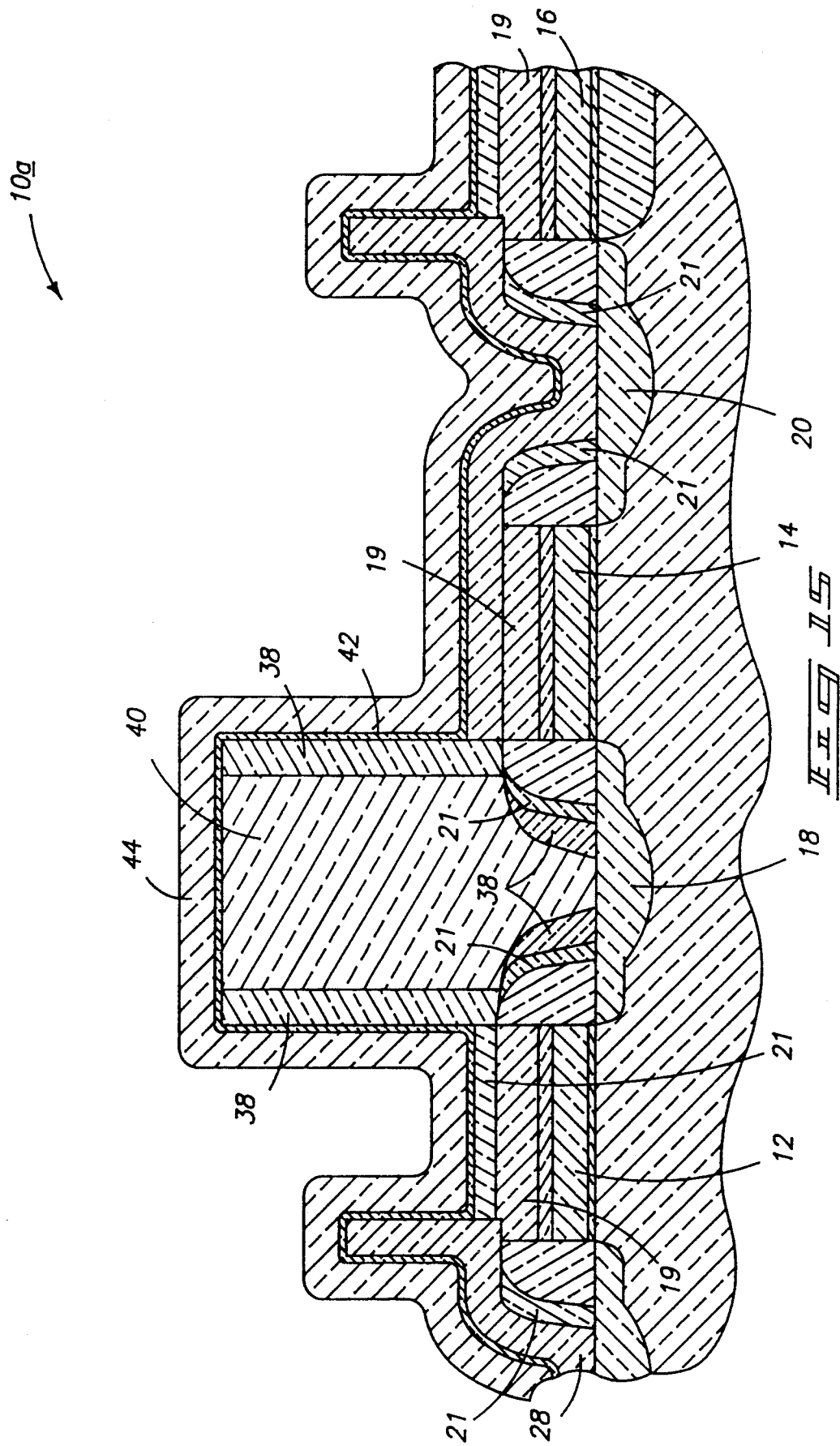

FIG. 15 is a diagrammatic section of the FIG. 10 wafer illustrated at a processing step subsequent to that shown by FIG. 14.

Figure 16:
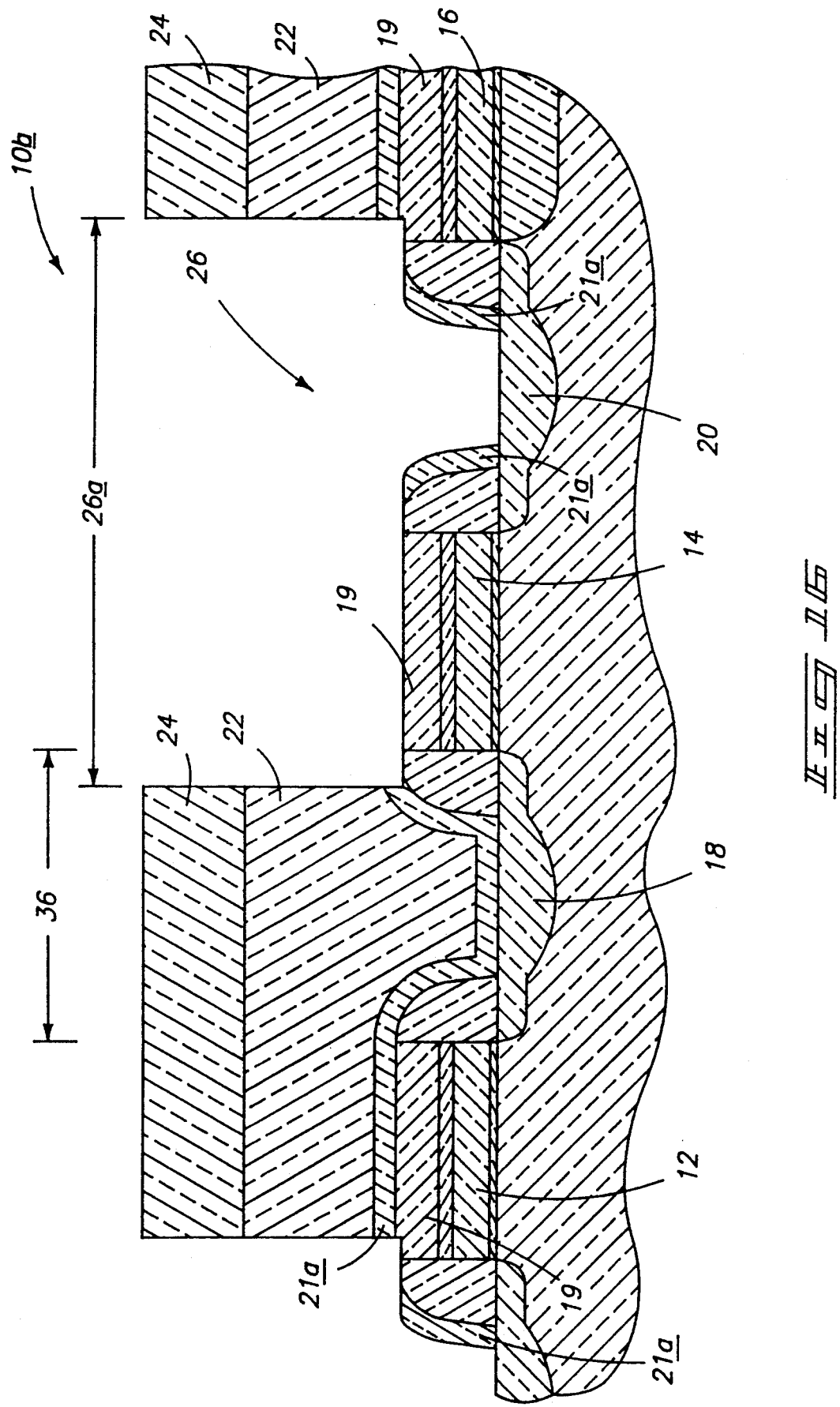

FIG. 16 is a diagrammatic section of a semiconductor wafer processed in accordance with yet other aspects of the invention.

Figure 17:
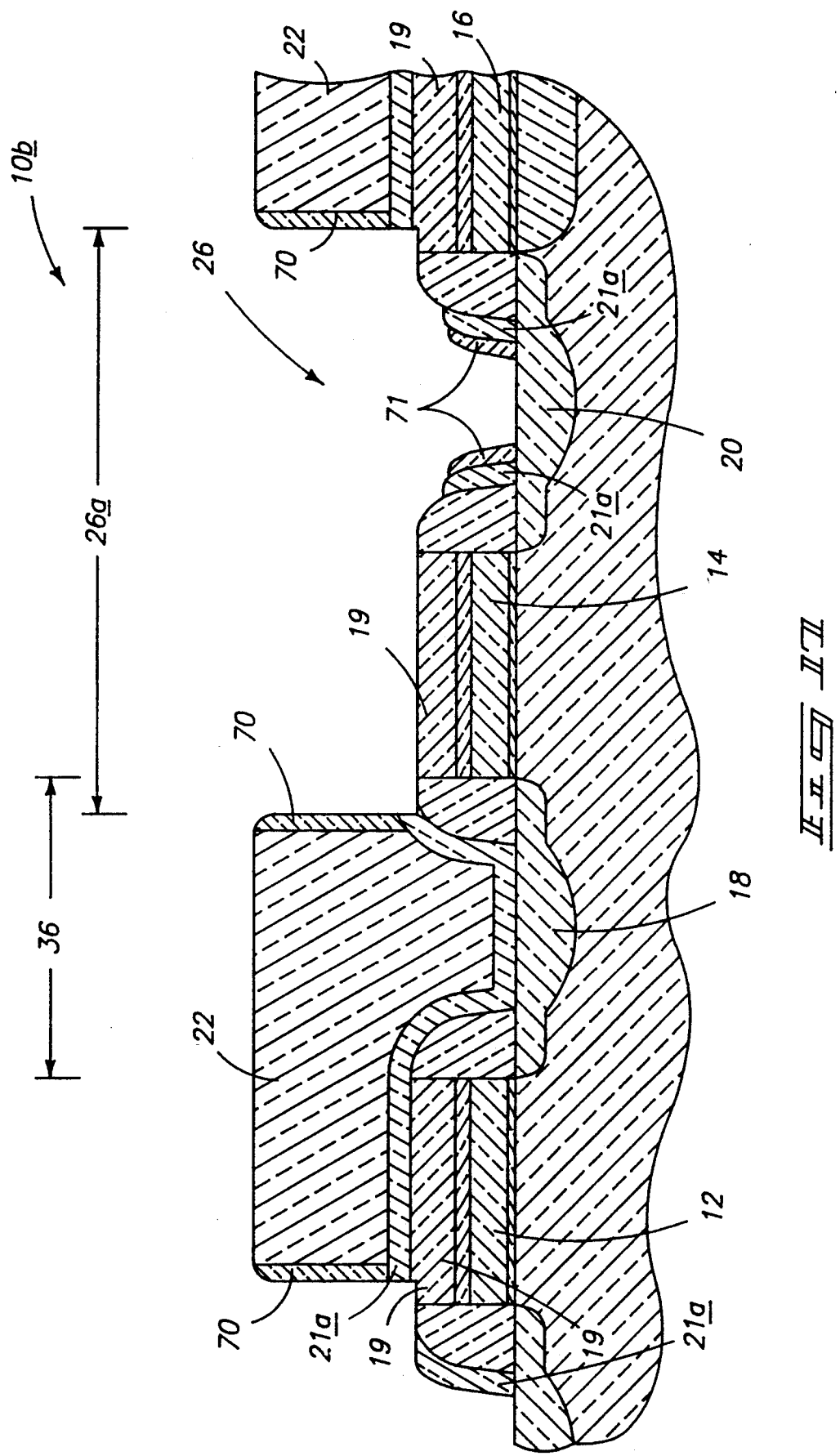

FIG. 17 is a view of the FIG. 16 wafer illustrated at a processing step subsequent to that shown by FIG. 16.

Figure 18:
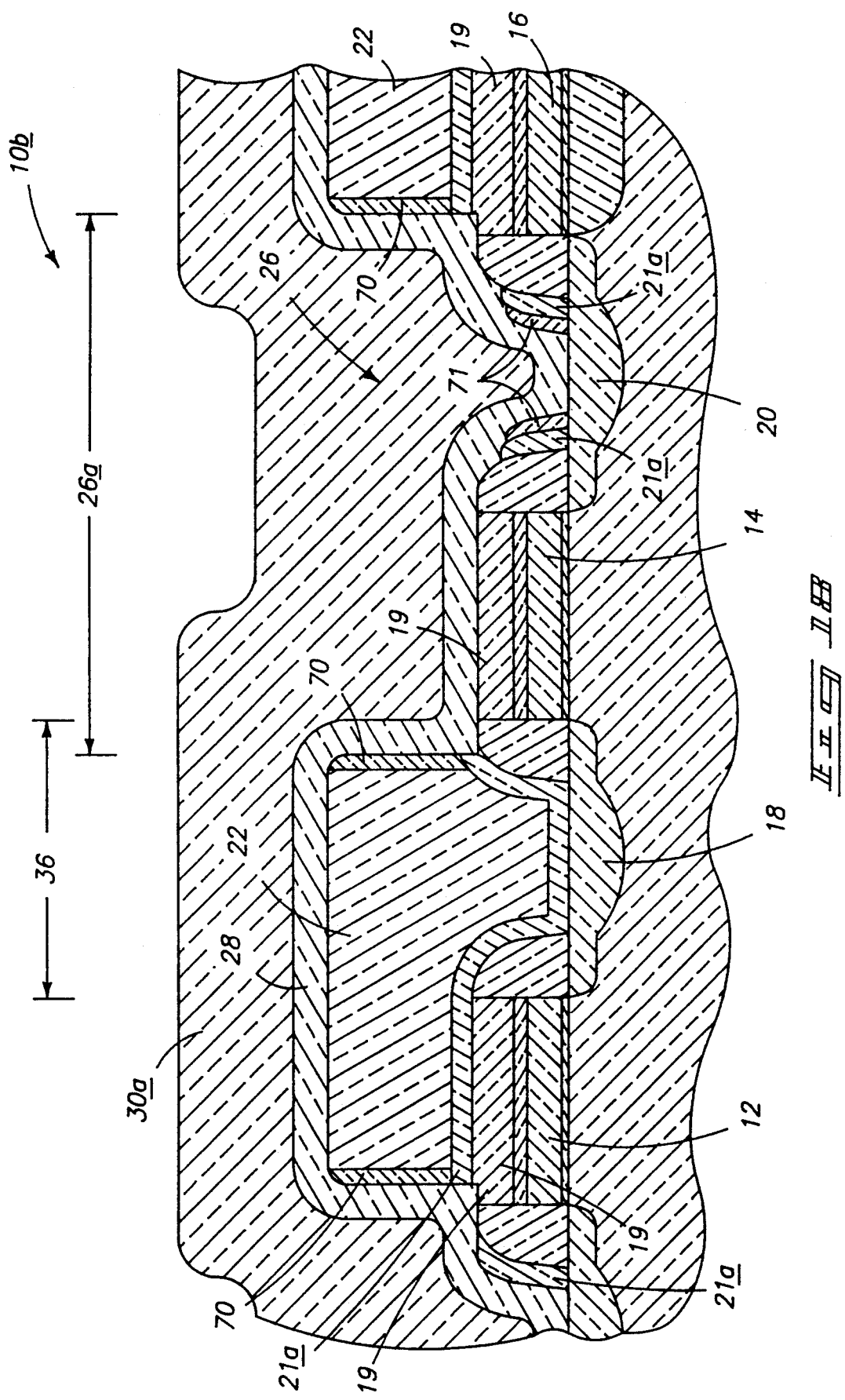

FIG. 18 is a view of the FIG. 16 wafer illustrated at a processing step subsequent to that shown by FIG. 17.

Figure 19:
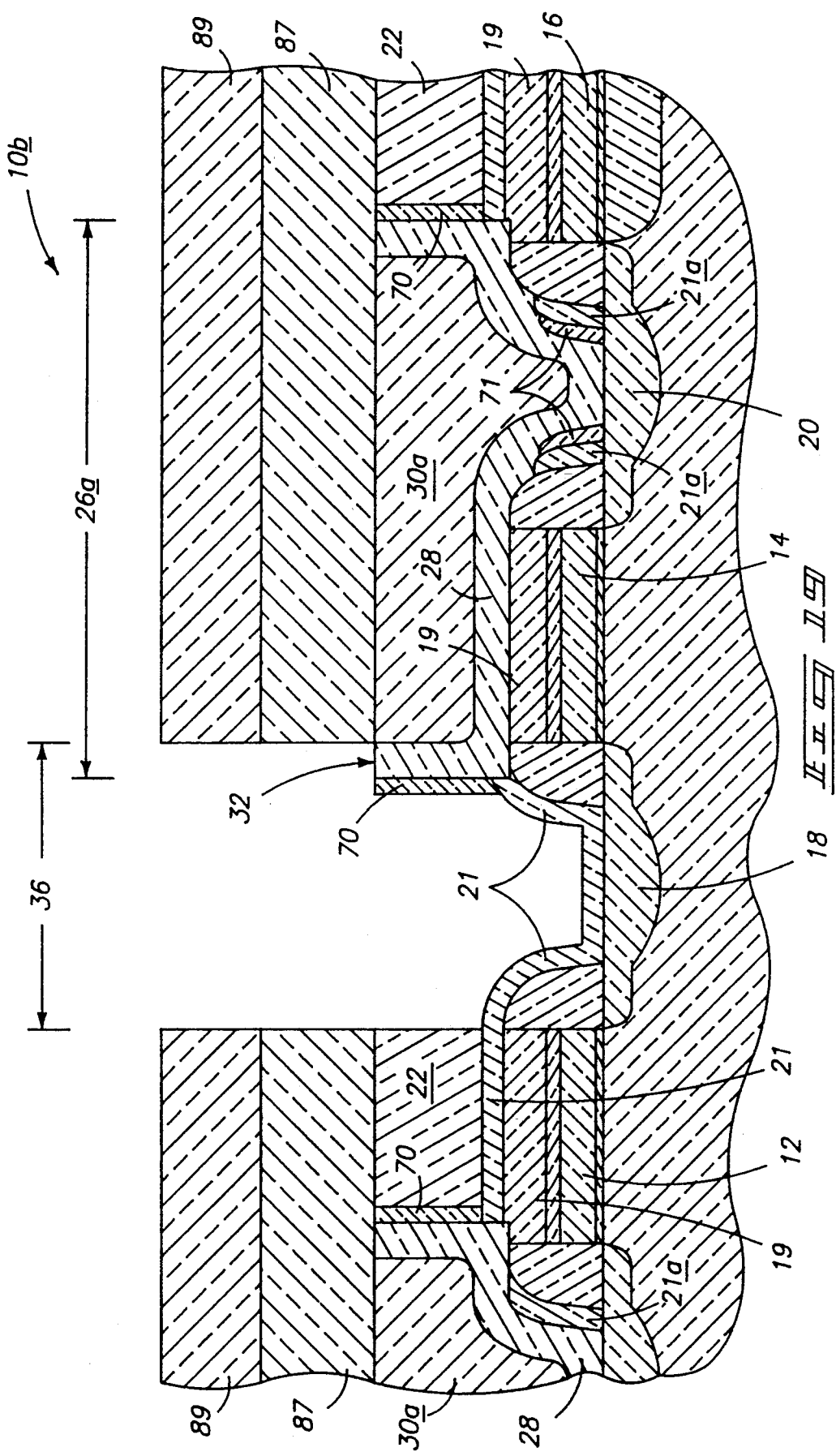

FIG. 19 is a view of the FIG. 16 wafer illustrated at a processing step subsequent to that shown by FIG. 18.

Figure 20:
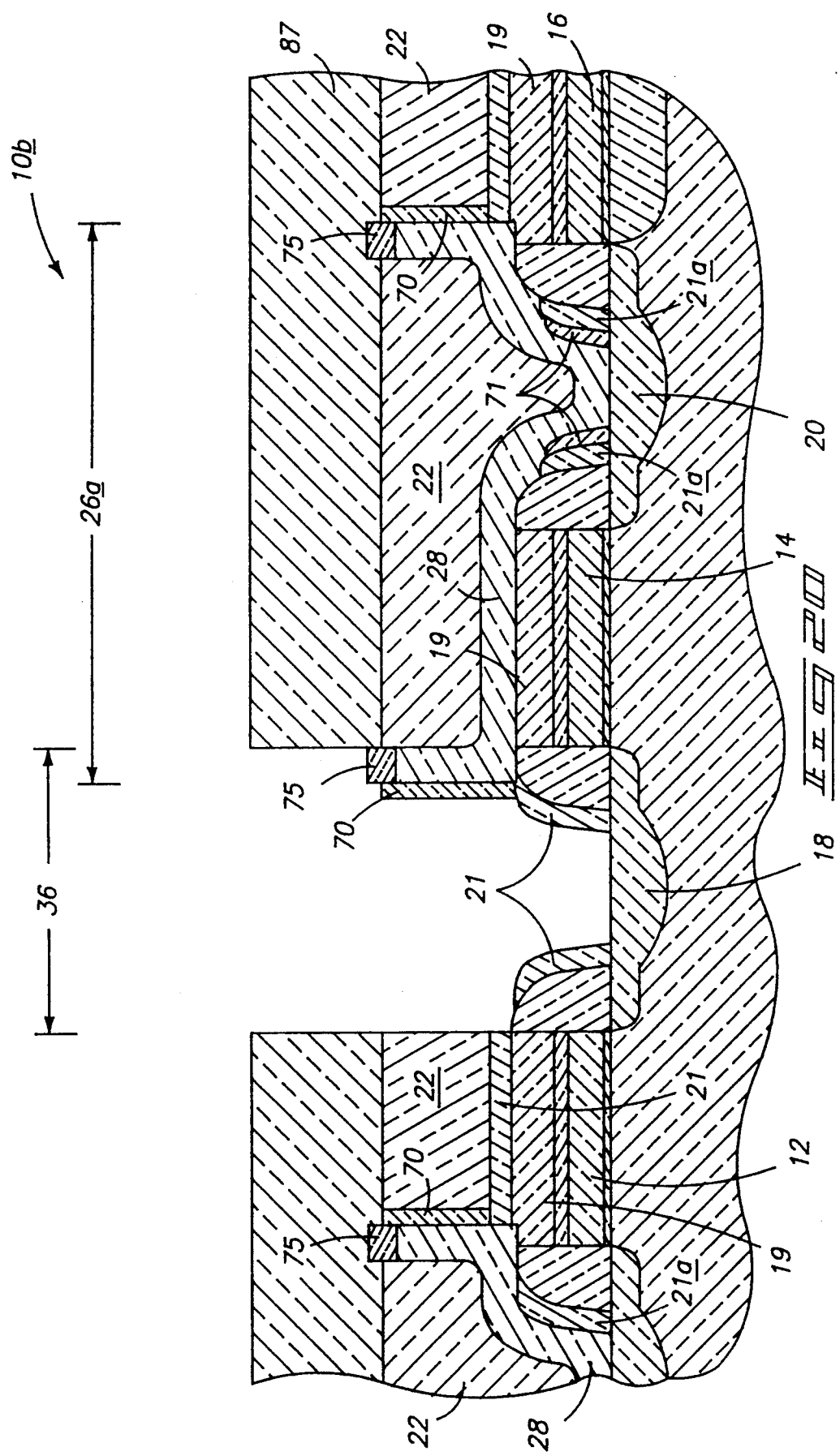

FIG. 20 is a view of the FIG. 16 wafer illustrated at a processing step subsequent to that shown by FIG. 19.

FIG. 21 is a view of the FIG. 16 wafer illustrated at a processing step subsequent to that shown by FIG. 20.

DETAILED DESCRIPTION OF THE PREFERRED EMBODIMENTS

This disclosure of the invention is submitted in furtherance of the constitutional purpose of the U.S. Patent Laws "to promote the progress of science and useful arts" (Article 1, Section 8).

In accordance with one aspect of the invention, a method of forming a bit line-over-capacitor array of memory cell comprises:

providing an array of substantially electrically isolated word lines atop a semiconductor wafer;

providing active areas about the word lines to define an array of memory cell FETs, the active areas being defined by a first active region for electrical connection with a memory cell capacitor and a second active region for electrical connection with a bit line;

providing a layer of a first material atop the wafer to a selected thickness, the first material being selectively etchable relative to oxide and polysilicon;

patterning and etching the layer of first material to define buried contact openings to the first active regions;

providing a first layer of conductively doped polysilicon to a selected thickness atop the wafer over the patterned layer of first material and within the buried contacts;

providing a layer of second material atop the wafer to a selected thickness over the first layer of conductively doped polysilicon, the second material being selectively etchable relative to oxide and polysilicon;

etching the layer of second material and first layer of polysilicon over the patterned layer of first material to define isolated cell storage nodes which contact the first active regions;

providing a layer of third material atop the wafer to a selected thickness over the isolated cell storage nodes and remaining layer of second material, the third material being selectively etchable relative to oxide and polysilicon;

patterning and etching the layers of third and first material to define bit line contact openings to the second active regions;

providing insulating spacers of oxide within the bit line contact openings;

providing conductive material pillars within the bit line contact openings having the oxide insulating spacers therewithin, the pillars being surrounded by the oxide insulating spacers;

etching remaining portions of the layers of first, second and third materials from the wafer;

providing a capacitor cell dielectric layer atop the individual storage nodes;

providing a capacitor cell polysilicon layer atop the capacitor cell dielectric layer to define an array of memory cell capacitors;

providing an insulating layer atop the cell polysilicon layer; and providing an array of digit lines atop the wafer which electrically connect with the conductive material pillars elevationally above the cell capacitors.

Preferably, the first, second and third materials are comprised predominantly of polyimide. Polysilicon and oxide are also selectively etchable relative to polyimide. Also, the layer of second material and first layer of polysilicon are etched to define the isolated cell storage nodes without any prior patterning or masking of the layer of second material and first layer of polysilicon.

Three embodiments are shown by the accompanying drawings. A first embodiment is described with reference to FIGS. 1-9. Referring first to FIG. 1, a semiconductor wafer is indicated generally by reference numeral 10. Wafer 10 has been provided with an array of substantially electrically isolated word lines, such as the illustrated word lines 12, 14 and 16. Such word lines are of a conventional construction having a lowermost gate oxide, a lower polysilicon layer, an overlying silicide layer such as tungsten silicide, an oxide cap, and side oxide spacers. The oxide cap is designated with numeral 19, as it is referred to below. The other conventional features of word lines 12, 14 and 16 are not designated with numerals for clarity in the drawings. The illustrated cross section has been taken on a diagonal cut through the array, with three FETs, thereby being represented in the figures.

Active areas are provided about the word lines, such as active regions 18 and 20 about word line 14, to define an array of memory cell FETs. The discussion proceeds with reference to FET 14 which will be provided with a capacitor construction for definition of a single memory cell. Active region 20 defines a first active region for electrical connection with a memory cell capacitor (described below) and active region 18 defines a second active region for electrical connection with a bit line (described below).

A protective barrier layer 21 is provided atop wafer 10 to a selected thickness of from about 100 Angstroms to about 1000 Angstroms, with about 500 Angstroms being most preferred. In one aspect of the invention, layer 21 is comprised of an insulating material, such as $SiO_x$ deposited by CVD of TEOS. In another aspect of the invention, protective barrier layer 21 is comprised of a material which is selectively etchable relative to oxide material, as is described in connection with the second embodiment. The function of layer 21 is more fully described below.

A layer 22 of a first material is applied atop the wafer over layer 21 to a selected thickness. The first material should be selectively etchable relative to oxide and polysilicon. The first material as well preferably provides a substantially planar upper surface. The material of choice is polyimide which is spun onto wafer 10. The preferred thickness for layer 22 is from about 5000 Angstroms to about 15,000 Angstroms above the upper surface of oxide cap 19. Where polyimide is used, oxide layer 21 functions as a protection/barrier layer to prevent any attack or migration of polyimide from layer 22 into the substrate by the various subsequent processing steps.

FIG. 1 illustrates layer 22 of polyimide having been patterned with photoresist 24 and etched to define buried contact openings 26 to selected second active regions 20. Such buried contact openings 26 laterally overlap adjacent word lines elevationally above adjacent word lines. Oxide layer 21 within contact opening 26 is thereafter etched to upwardly expose active region 20. Etch of the polyimide can be conducted by reactive ion etching (RIE) in $O_2$ plasma which exhibits a near 100% selectivity to oxide. Oxide layer 21 within contact opening 26 can also be reactive ion etching by known techniques to expose active region 20.

Figure 2:
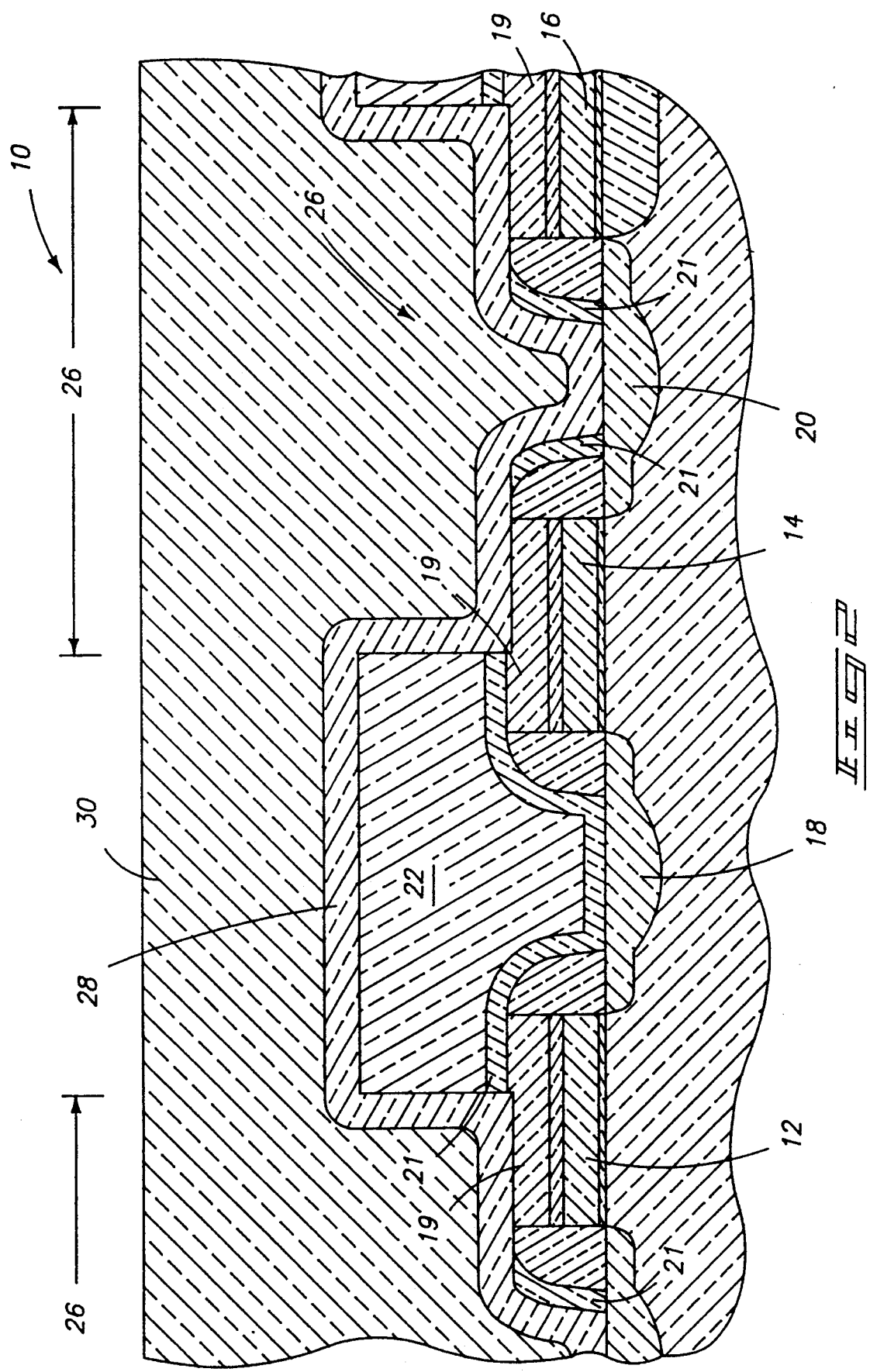
FIG. 2 is a diagrammatic section of the FIG. 1 wafer illustrated at a processing step subsequent to that shown by FIG. 1.

Referring to FIG. 2, photoresist 24 has been removed and a first layer 28 of conductively doped polysilicon has been provided to a selected thickness atop the wafer over the patterned first polyimide layer 22 and within buried contacts 26. The preferred thickness of first polysilicon layer 28 is from about 300 Angstroms to about 1,500 Angstroms, with about 600 Angstroms being most preferred.

A layer 30 of a second material is applied atop the wafer to a selected thickness over first layer 28 of conductively doped polysilicon. The second material should be selectively etchable relative to oxide and polysilicon. Additionally, the second material is preferably etchable at substantially the same rate as the first material. The material of choice is polyimide which is spun coat onto the wafer at a depth sufficient to fill the buried contact cavities 26 and cover the upper portions of polysilicon layer 28 and provide an upper flat wafer surface.

Figure 3:
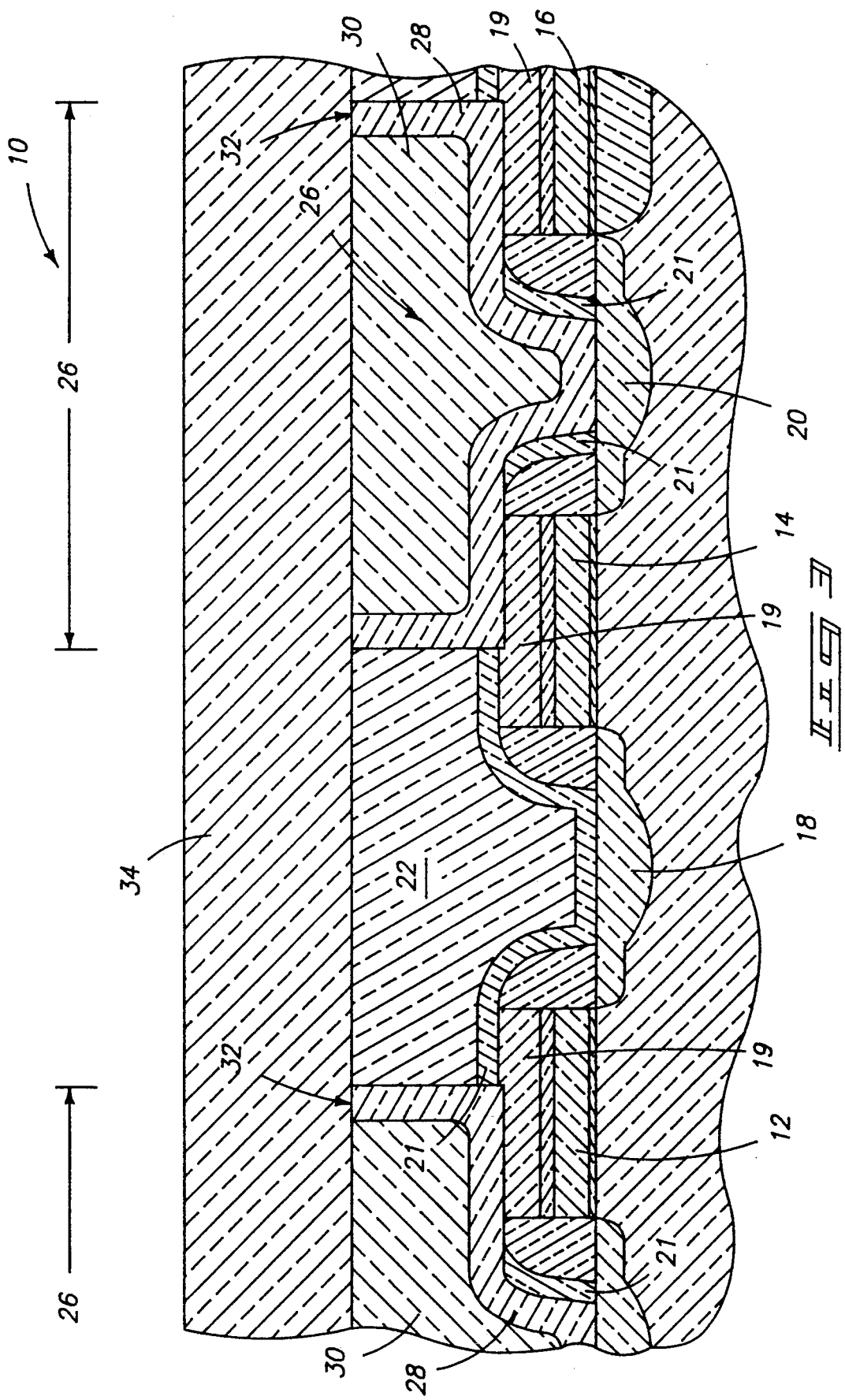
FIG. 3 is a diagrammatic section of the FIG. 1 wafer illustrated at a processing step subsequent to that shown by FIG. 2

Referring to FIG. 3, second polyimide layer 30 and first polysilicon layer 28 are chemical mechanically polished (CMP) or otherwise blanket etched back to define isolated cell storage nodes 32 which contact first active regions 20. Note that the above described technique did not require any prior patterning or masking of layers 30 and 28.

A layer 34 of third material is then applied atop the wafer to a selected thickness over isolated cell storage nodes 32 and remaining portions of layer 30 and layer 22. The third material should again be selectively etchable relative to oxide and polysilicon. The preferred material of choice is again polyimide which is spun coat onto the wafer to a thickness of from about 3000 Angstroms to about 8000 Angstroms, with about 4000 Angstroms being most preferred.

Figure 4:
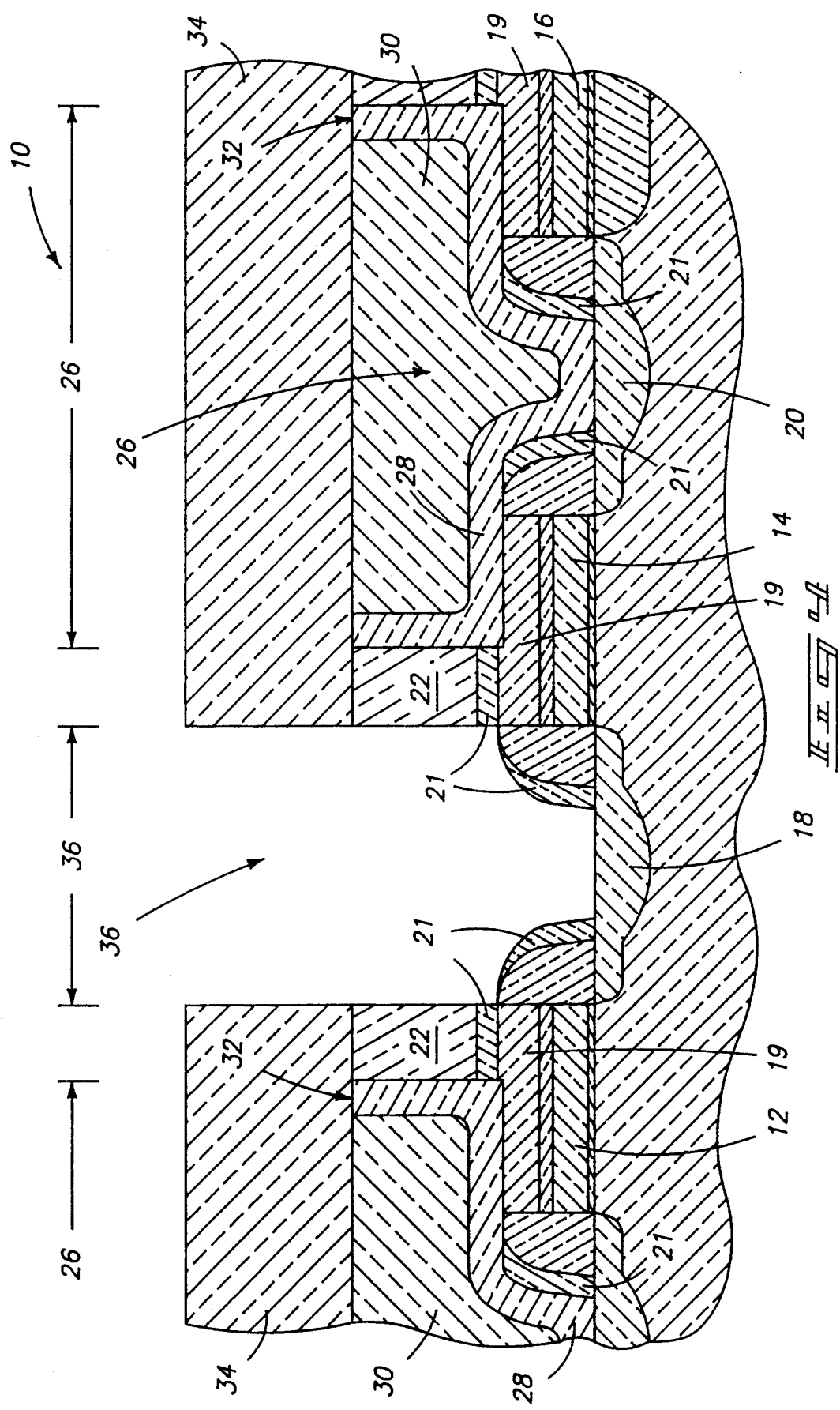
FIG. 4 is a diagrammatic section of the FIG. 1 wafer illustrated at a processing step subsequent to that shown by FIG. 3.

Referring to FIG. 4, third layer 34 and first layer 22 of polyimide are patterned and etched to define bit line contact openings 36 to second active regions 18. Oxide layer 21 is as well etched to upwardly expose active regions 18. Bit line contact openings 36 are laterally spaced from the adjacent buried contact openings 26 preferably by the design misalignment tolerance plus 0.10 micron.

Figure 5:
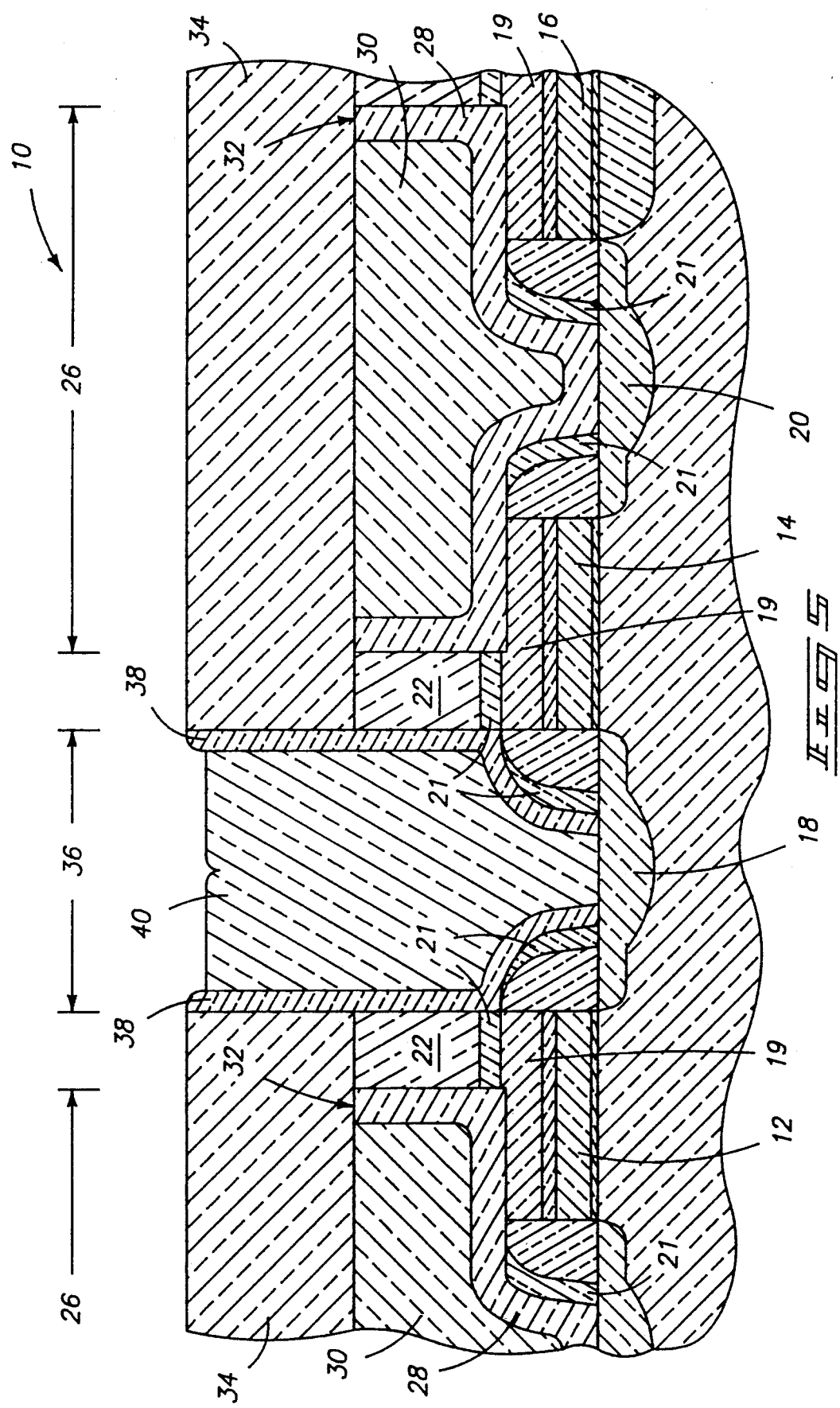
FIG. 5 is a diagrammatic section of the FIG. 1 wafer illustrated at a processing step subsequent to that shown by FIG. 4.

Referring to FIG. 5, a layer of oxide, preferably from about 200 Angstroms to about 1,000 Angstroms, is deposited and anisotropically etched to provide insulating spacers 38 within bit line contact openings 36. A conductive material, such as tungsten or doped polysilicon, is thereafter provided atop the wafer and etched back or chemical mechanical polished back to define conductive metal pillars 40 within bit line contact openings 36. Pillars 40 are surrounded by oxide insulating spacers 38. Note that such constructions could of course also be provided as desired in the periphery of the array. Note that with this aspect of the disclosure, the bit line contact is self-aligned with respect to the word lines is spaced away from the polysilicon of isolated storage nodes 32. If it is desired to contact word line poly, at some earlier step in the process the oxide (layer 19) could be cleared above the word lines to make contact to the word lines (poly 1) and still have active area contacts self aligning with respect to the word lines.

Figure 6:
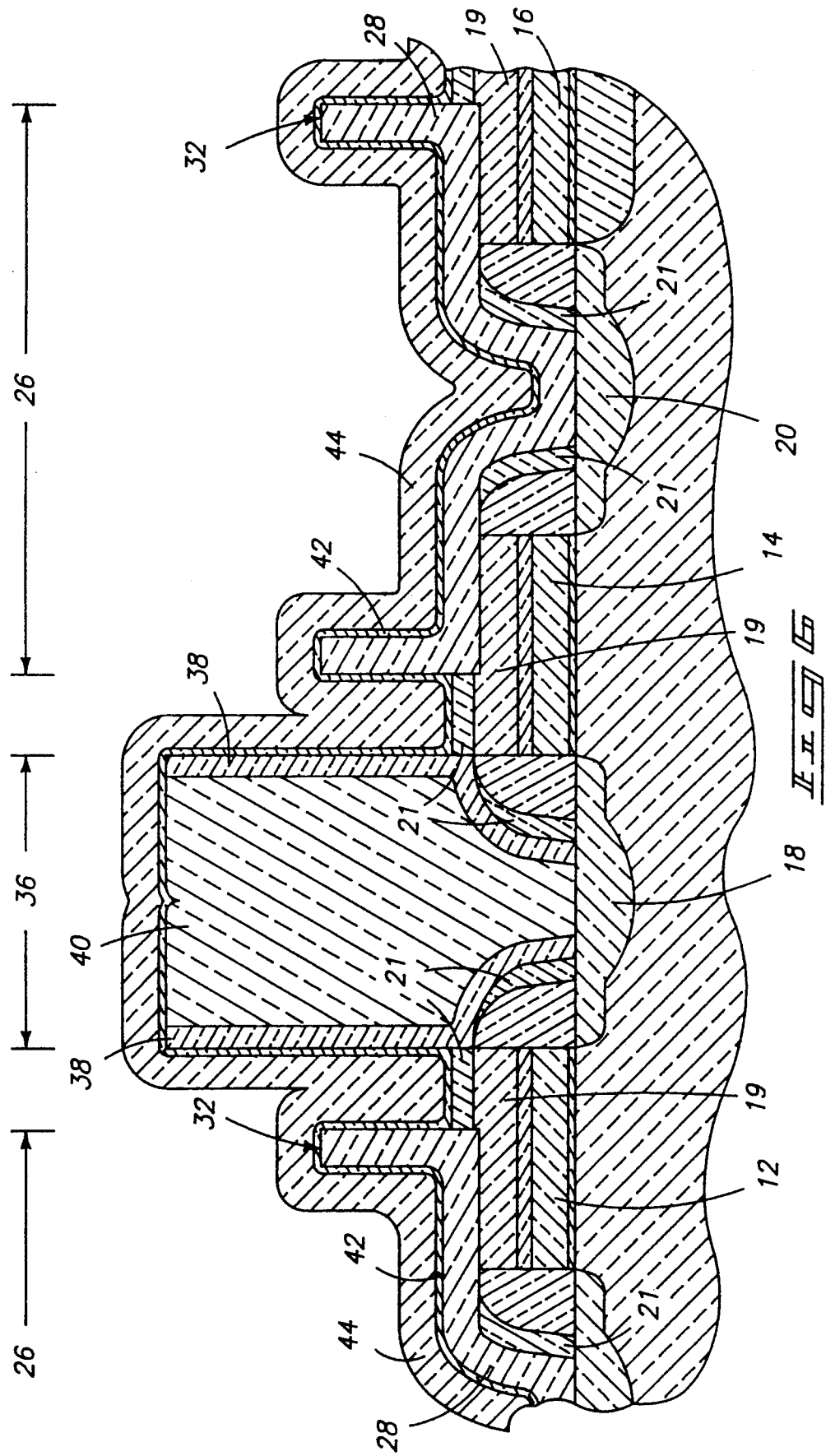
FIG. 6 is a diagrammatic section of the FIG. 1 wafer illustrated at a processing step subsequent to that shown by FIG. 5.

Referring to FIG. 6, first polyimide layer 22, second polyimide layer 30 and third polyimide 34 have been stripped from the wafer, preferably using $O_2$ plasma, which provides substantially 100% selectivity to all other layers on the wafer. Thereafter, a capacitor cell dielectric layer 42 is applied atop the wafer and individual storage nodes 32. Cell dielectric layer 42 is preferably comprised of a conventional ONO construction, arrived at from a wet anneal of a nitride layer. Its thickness is preferably about 70 Angstroms. A layer 44 of capacitor cell polysilicon is provided atop capacitor cell dielectric layer 42 to define an array of memory cell capacitors. Polysilicon layer 44 is conductively doped, and preferably provided to a thickness of from about 500 Angstroms to about 2000 Angstroms, with about 1000 Angstroms being most preferred.

Referring to FIG. 7, a layer 46 of photoresist is applied atop the wafer to a sufficient depth to cover the formed pillars, and is utilized to selectively pattern peripheral cells as desired. Photoresist layer 46 is subjected to a blanket $O_2$ plasma etch back to remove polysilicon and nitride from atop pillars 40, and thereby upwardly expose pillars 40.

Referring to FIG. 8, wafer 10 is subjected to a timed wet polysilicon etch or plasma isotropic etch to clear polysilicon from the periphery and etch exposed cell poly layer 44 downwardly from the upper surface of the bit line pillars, as shown.

Referring to FIG. 9, photoresist 46 is stripped and an oxide layer 48 deposited. A planarization etch (such as CMP) is conducted on layer 48 to re-expose bit line pillars 40 and etch any remaining dielectric from atop the pillars. Thereafter, conductive digit line material 49, such as sputtered metal, is deposited, patterned and etched to provide an array of digit lines atop the wafer which electrically connect with conductive pillar material 40 at locations elevationally above the cell capacitor poly 44.

The above described preferred embodiment provides a significant advantage of having all critical photo steps being conducted on a flat wafer surface. This enables smaller feature sizes for a given lithographic tool capacity, thereby enabling maximized density. Also in accordance with the above preferred embodiment, there is a saving of a mask step in simultaneously defining the storage node cavity and contact. Typical prior art processes require first defining a contact opening, applying polysilicon, and thereafter patterning the polysilicon using a mask to define the isolated storage nodes. Such additional mask steps required an additional alignment resulting in a larger cell for a given feature size.

The discussion proceeds with reference to FIGS. 10-15. Common numerals from the FIGS. 1-9 embodiment are utilized where appropriate. FIG. 10 illustrates a semiconductor wafer 10a having the same word lines, active areas, protective barrier layer and first layer of polyimide. However, buried contact opening 26a has been misaligned to the left such that bit line contact opening 36 and adjacent buried contact 26a overlap (FIG. 11). Referring to FIG. 11, etching of the various polyimide layers to define bit line contact opening 36 produces a resultant portion of an isolated storage node 32 which projects within opening 36.

Referring to FIG. 12, to prevent any undesired resultant capacitor to bit line short, that portion of polysilicon runner 32 projecting to within contact opening 36 is etched selectively relative to oxide and polyimide to remove it from within contact opening 36. Such will leave a resultant vertical walled construction of capacitor storage nodes with a portion that has been removed, such as is illustrated in FIG. 13.

FIG. 14 illustrates the resultant insulating oxide spacers having been provided within the bit line contact opening, and subsequently provided conducting plug 40 for pillar formation.

Referring to FIG. 15, the various layers of polyimide are stripped, followed by deposition of cell dielectric layer 42 and cell poly layer 44. Processing would continue from this point as is described above with respect to the first described embodiment.

Although the immediately described above embodiment has dealt with overcoming a misalignment, the above described techniques could also be utilized were it desired to purposely devise constructions where adjacent bit line contact openings and storage node capacitor openings overlap to reduce the overall memory cell size and increase the density.

The discussion proceeds with reference to FIGS. 16-21. There illustrated is a construction analogous to the immediately proceeding described embodiment, in that 26a and 36 overlap. However here, the storage node projecting into bit line contact opening 36 will be insulated therewithin, as opposed to being etched from the wafer.

FIG. 16 illustrates a wafer fragment 10b the same as that illustrated in FIG. 10, but for protective barrier layer 21a being provided of a material which is selectively etchable relative to oxide. An example material includes nitrides, such as $Si_3N_4$. First layer 21a of nitride is preferably provided to a thickness of from about 100 Angstroms to about 500 Angstroms, with about 300 Angstroms being most preferred.

After patterning to form buried contact opening 26a, a second layer of nitride is provided atop the wafer to a preferred thickness of from about 100 Angstroms to about 500 Angstroms, with about 300 Angstroms being most preferred. Such layer is anisotropically etched to provide nitride spacers 70 (FIG. 17) about the first layer of polyimide. Such also produces spacer 71 within buried contact opening 26a.

Referring to FIG. 18, layer 28 of storage node polysilicon is provided atop the wafer, followed by deposition of a second nitride layer 30a which replaces the polyimide 30 of the above two described embodiments. The purpose for nitride material 30a and nitride spacers 70 will become apparent from the continuing discussion.

Referring to FIG. 19, wafer 10b has been subjected to chemical mechanical polishing to isolate poly storage nodes 32, and leave the storage node cavity filled with nitride. An additional layer 87 of polyimide is applied atop the wafer, as described above with respect to the previous embodiments. Wafer 10b is then patterned and etched with photoresist layer 89 to define bit line contact openings 36. As with the immediately above described embodiment, portions of storage node 32 project into bit line contact opening 36. As is also apparent, the external sides of storage nodes 32 are coated with remaining portions of first nitride layer 21a. Additionally, the internal cavity of the capacitor cells remains filled with nitride material from second nitride layer 30a.

Referring to FIG. 20, wafer 10b is subjected to a low temperature thermal oxidation to convert any exposed storage node poly into $SiO_2$, such as $SiO_2$ cap regions 75. Such oxidation would typically consume from about 400 to 600 Angstroms of polysilicon. Nitride spacer 71 and nitride material 30a are provided to prevent oxidation of storage node poly which would otherwise occur were an oxidation barrier not present. Polyimide is transmissive of oxidation reactants such that its coating presence over polysilicon will not prevent oxidation thereof (thus the need for the nitride). Accordingly, the presence of the nitride prevents the entirety of the storage nodes 22 from being oxidized during the oxidation which produces regions 75.

Referring to FIG. 21, the wafer is patterned and processed in accordance with the above to define bit line pillars with an additional nitride strip prior to cell nitride deposition and associated capacitor dielectric and cell poly layers as shown. The wafer would thereafter be processed in accordance with the above described first two embodiments.

As an alternate to the immediately above described technique, the storage node poly could be covered with a thin layer of nitride (i.e., approximately 200 Angstroms) as opposed to a very thick of layer of nitride. Thereafter, polyimide could be applied to function as layer 30, 30a. The thin layer of intervening nitride would cover and protect the storage node poly from oxidation during the above described step for isolating the storage node poly within bit line contact opening 36.

In compliance with the statute, the invention has been described in language more or less specific as to structural and methodical features. It is to be understood, however, that the invention is not limited to the specific features shown and described, since the means and construction herein disclosed comprise preferred forms of putting the invention into effect. The invention is, therefore, claimed in any of its forms or modifications within the proper scope of the appended claims appropriately interpreted in accordance with the doctrine of equivalents.

I claim:

1. A method of forming a bit line over capacitor array of memory cells comprising:

providing an array of substantially electrically isolated word lines atop a semiconductor wafer;

providing active areas about the word lines to define an array of memory cell FETs, the active areas being defined by a first active region for electrical connection with a memory cell capacitor and a second active region for electrical connection with a bit line;

providing a first layer of polyimide atop the wafer to a selected thickness, the first layer of polyimide having a substantially planar upper surface;

patterning and etching the first layer of polyimide to define buried contact openings to the first active regions;

providing a first layer of conductively doped polysilicon to a selected thickness atop the wafer over the patterned first layer of polyimide and within the buried contacts;

providing a second layer of polyimide atop the wafer to a selected thickness over the first layer of conductively doped polysilicon, the second layer of polyimide having a substantially planar upper surface;

etching the second layer of polyimide and first layer of polysilicon over the patterned first layer of polyimide to define isolated cell storage nodes which contact the first active regions;

providing a third layer of polyimide atop the wafer to a selected thickness over the isolated cell storage nodes;

patterning and etching the third and first layers of polyimide to define bit line contact openings to the second active regions;

providing insulating spacers within the bit line contact openings;

providing conductive material pillars within the bit line contact openings having the insulating spacers therewithin, the pillars being surrounded by the insulating spacers;

etching remaining portions of the first, second and third layers of polyimide from the wafer;

providing a capacitor cell dielectric layer atop the individual storage nodes;

providing a capacitor cell polysilicon layer atop the capacitor cell dielectric layer to define an array of memory cell capacitors;

providing an insulating layer atop the cell polysilicon layer; and providing an array of digit lines atop the wafer which electrically connect with the conductive material pillars elevationally above the cell capacitors.

2. The method of forming a bit line over capacitor array of memory cells of claim 1 wherein the second polyimide layer and first layer of polysilicon are etched to define the isolated cell storage nodes without any prior patterning or masking of the second polyimide layer and first layer of polysilicon.

3. The method of forming a bit line over capacitor array of memory cells of claim 1 further comprising providing a protective barrier layer atop the wafer to a selected thickness prior to providing the first layer of polyimide atop the wafer.

4. The method of forming a bit line over capacitor array of memory cells of claim 3 wherein the selected thickness of the protective barrier layer is from about 100 Angstroms to about 1000 Angstroms, and the protective barrier layer is comprised of an oxide material.

5. The method of forming a bit line over capacitor array of memory cells of claim 3 wherein the selected thickness of the protective barrier layer is from about 100 Angstroms to about 1000 Angstroms, and the protective barrier layer is comprised of material which is selectively etchable relative to oxide material.

6. The method of forming a bit line over capacitor array of memory cells of claim 1 wherein the selected thickness of the first layer of polyimide is provided to from about 5000 Angstroms to about 15,000 Angstroms above the electrically isolated word lines.

7. The method of forming a bit line over capacitor array of memory cells of claim 1 wherein the first layer of conductively doped polysilicon has a peak elevation between adjacent word lines, the selected thickness of the second layer of polyimide being provided to from about 300 Angstroms to about 1000 Angstroms above the peak elevation.

8. The method of forming a bit line over capacitor array of memory cells of claim 1 wherein,
the selected thickness of the first layer of polyimide is provided to from about 5000 Angstroms to about 15,000 Angstroms above the electrically isolated word lines; and
the first layer of conductively doped polysilicon has a peak elevation between adjacent word lines, the selected thickness of the second layer of polyimide being provided to from about 300 Angstroms to about 1000 Angstroms above the peak elevation.

9. The method of forming a bit line over capacitor array of memory cells of claim 1 wherein the first layer of polyimide is patterned and etched to define buried contact openings which laterally overlap adjacent word lines elevationally above adjacent word lines, the bit line contact openings being laterally spaced from adjacent buried contact openings.

10. The method of forming a bit line over capacitor array of memory cells of claim 1 wherein the first layer of polyimide is patterned and etched to define buried contact openings which laterally overlap adjacent word lines elevationally above adjacent word lines, the bit line contact openings overlapping with adjacent buried contact openings, the isolated storage nodes projecting into the bit line contact openings.

11. The method of forming a bit line over capacitor array of memory cells of claim 10 further comprising electrically insulating about the portions of the storage nodes projecting into the bit line contact openings.

12. The method of forming a bit line over capacitor array of memory cells of claim 10 further comprising etching away the portions of the storage nodes projecting into the bit line contact openings.

13. A method of forming a bit line over capacitor array of memory cells comprising:
providing an array of substantially electrically isolated word lines atop a semiconductor wafer;
providing active areas about the word lines to define an array of memory cell FETs, the active areas being defined by a first active region for electrical connection with a memory cell capacitor and a second active region for electrical connection with a bit line;
providing a first layer of polyimide atop the wafer to a selected thickness, the first layer of polyimide having a substantially planar upper surface;
patterning and etching the first layer of polyimide to define buried contact openings to the first active regions;
providing a first layer of conductively doped polysilicon to a selected thickness atop the wafer over the patterned first layer of polyimide and within the buried contacts;
providing a layer of material which is selectively etchable relative to polysilicon atop the wafer to a selected thickness over the first layer of conductively doped polysilicon;
etching the layer of material and first layer of polysilicon over the patterned first layer of polyimide to define isolated cell storage nodes which contact the first active regions;
providing a second layer of polyimide atop the wafer to a selected thickness over the isolated cell storage nodes and remaining layer of material;
patterning and etching the second and first layers of polyimide to define bit line contact openings to the second active regions;
providing insulating spacers within the bit line contact openings;
providing conductive material pillars within the bit line contact openings having the insulating spacers therewithin, the pillars being surrounded by the insulating spacers;
etching remaining portions of the first and second layers of polyimide and layer of material from the wafer;
providing a capacitor cell dielectric layer atop the individual storage nodes;
providing a capacitor cell polysilicon layer atop the capacitor cell dielectric layer to define an array of memory cell capacitors;
providing an insulating layer atop the cell polysilicon layer; and
providing an array of digit lines atop the wafer which electrically connect with the conductive material pillars elevationally above the cell capacitors.

14. The method of forming a bit line over capacitor array of memory cells of claim 13 wherein the layer of material and first layer of polysilicon are etched to define the isolated cell storage nodes without any prior patterning or masking of the layer of material and first layer of polysilicon.

15. The method of forming a bit line over capacitor array of memory cells of claim 13 further comprising providing a protective barrier layer atop the wafer to a selected thickness prior to providing the first layer of polyimide atop the wafer.

16. The method of forming a bit line over capacitor array of memory cells of claim 13 wherein the selected thickness of the layer of material is from about 300 Angstroms to about 1000 Angstroms, the layer of material being comprised of a nitride.

17. The method of forming a bit line over capacitor array of memory cells of claim 13 wherein the first layer of polyimide is patterned and etched to define buried contact openings which laterally overlap adjacent word lines elevationally above adjacent word lines, the bit line contact openings being laterally spaced from adjacent buried contact openings.

18. The method of forming a bit line over capacitor array of memory cells of claim 13 wherein the first layer of polyimide is patterned and etched to define buried contact openings which laterally overlap adjacent word lines elevationally above adjacent word lines, the bit line contact openings overlapping with adjacent buried contact openings, the isolated storage nodes projecting into the bit line contact openings.

19. The method of forming a bit line over capacitor array of memory cells of claim 18 further comprising electrically insulating about the portions of the storage nodes projecting into the bit line contact openings.

20. The method of forming a bit line over capacitor array of memory cells of claim 18 further comprising etching away the portions of the storage nodes projecting into the bit line contact openings.

21. A method of forming a bit line over capacitor array of memory cells comprising:
- providing an array of substantially electrically isolated word lines atop a semiconductor wafer;
- providing active areas about the word lines to define an array of memory cell FETs, the active areas being defined by a first active region for electrical connection with a memory cell capacitor and a second active region for electrical connection with a bit line;
- providing a layer of a first material atop the wafer to a selected thickness, the first material being selectively etchable relative to oxide and polysilicon;
- patterning and etching the layer of first material to define buried contact openings to the first active regions;
- providing a first layer of conductively doped polysilicon to a selected thickness atop the wafer over the patterned layer of first material and within the buried contacts;
- providing a layer of second material atop the wafer to a selected thickness over the first layer of conductively doped polysilicon, the second material being selectively etchable relative to oxide and polysilicon;
- etching the layer of second material and first layer of polysilicon over the patterned layer of first material to define isolated cell storage nodes which contact the first active regions;
- providing a layer of third material atop the wafer to a selected thickness over the isolated cell storage nodes and remaining layer of second material, the third material being selectively etchable relative to oxide and polysilicon;
- patterning and etching the layers of third and first material to define bit line contact openings to the second active regions;
- providing insulating spacers of oxide within the bit line contact openings;
- providing conductive material pillars within the bit line contact openings having the oxide insulation spacers therewithin, the pillars being surrounded by the oxide insulating spacers;
- etching remaining portions of the layers of first, second and third materials from the wafer;
- providing a capacitor cell dielectric layer atop the individual storage nodes;
- providing a capacitor cell polysilicon layer atop the capacitor cell dielectric layer to define an array of memory cell capacitors;
- providing an insulating layer atop the cell polysilicon layer; and
- providing an array of digit lines atop the wafer which electrically connect with the conductive material pillars elevationally above the cell capacitors.

22. The method of forming a bit line over capacitor array of memory cells of claim 21 wherein the layer of second material and first layer of polysilicon are etched to define the isolated cell storage nodes without any prior patterning or masking of the layer of second material and first layer of polysilicon.

23. The method of forming a bit line over capacitor array of memory cells of claim 21 further comprising providing a protective barrier layer atop the wafer to a selected thickness prior to providing the layer of first material atop the wafer.

24. The method of forming a bit line over capacitor array of memory cells of claim 23 wherein the selected thickness of the protective barrier layer is from about 100 Angstroms to about 1000 Angstroms, and the protective barrier layer is comprised of an oxide material.

25. The method of forming a bit line over capacitor array of memory cells of claim 23 wherein the selected thickness of the protective barrier layer is from about 100 Angstroms to about 1000 Angstroms, and the protective barrier layer is comprised of material which is selectively etchable relative to oxide material.

26. The method of forming a bit line over capacitor array of memory cells of claim 21 wherein the layer of first material is patterned and etched to define buried contact openings which laterally overlap adjacent word lines elevationally above adjacent word lines, the bit line contact openings being laterally spaced from adjacent buried contact openings.

27. The method of forming a bit line over capacitor array of memory cells of claim 21 wherein the layer of first material is patterned and etched to define buried contact openings which laterally overlap adjacent word lines elevationally above adjacent word lines, the bit line contact openings overlapping with adjacent buried contact openings, the isolated storage nodes projecting into the bit line contact openings.

28. The method of forming a bit line over capacitor array of memory cells of claim 27 further comprising electrically insulating about the portions of the storage nodes projecting into the bit line contact openings.

29. The method of forming a bit line over capacitor array of memory cells of claim 27 further comprising etching away the portions of the storage nodes projecting into the bit line contact openings.

30. A method of forming a bit line over capacitor array of memory cells comprising:
- providing an array of substantially electrically isolated word lines atop a semiconductor wafer;
- providing active areas about the word lines to define an array of memory cell FETs, the active areas being defined by a first active region for electrical connection with a memory cell capacitor and a second active region for electrical connection with a bit line;
- providing a first layer of nitride atop the word lines to a thickness of from about 100 Angstroms to about 500 Angstroms;
- providing a first layer of polyimide atop the wafer to a selected thickness, the first layer of polyimide having a substantially planar upper surface;
- patterning and etching the first layer of polyimide to define buried contact openings to the second active regions;

providing a second layer of nitride atop the patterned and etched first layer of polyimide to a thickness of from about 100 Angstroms to about 500 Angstroms;

anisotropically etching the second layer of nitride to provide nitride spacers about the patterned and etched first layer of polyimide;

providing a first layer of conductively doped polysilicon to a selected thickness atop the wafer over the patterned first layer of polyimide having nitride spacers and within the buried contacts;

providing a third layer of nitride to a selected thickness over the first layer of conductively doped polysilicon;

etching the third layer of nitride and first layer of polysilicon over the patterned first layer of polyimide to define isolated cell storage nodes which contact the first active regions, the buried contact openings laterally overlapping adjacent word lines elevationally above adjacent word lines;

providing a second layer of polyimide atop the wafer to a selected thickness over the isolated cell storage nodes and remaining third layer of nitride;

patterning and etching the second and first layers of polyimide to define bit line contact openings to the second active regions, the bit line contact openings laterally overlapping adjacent word lines elevationally above adjacent word lines, the bit line contact openings overlapping with adjacent buried contact openings, the isolated storage nodes projecting into the bit line contact openings;

providing insulating oxide about the portions of the storage nodes projecting into the bit line contact openings;

etching the first layer of nitride to expose the second active regions;

providing insulating spacers within the bit line contact openings;

providing conductive material pillars within the bit line contact openings having the insulating spacers therewithin, the pillars being surrounded by the insulating spacers;

etching remaining portions of the first and second layers of polyimide and third layer of nitride from the wafer;

providing a capacitor cell dielectric layer atop the individual storage nodes;

providing a capacitor cell polysilicon layer atop the capacitor cell dielectric layer to define an array of memory cell capacitors;

providing an insulating layer atop the cell polysilicon layer; and providing an array of digit lines atop the wafer which electrically connect with the conductive material pillars elevationally above the cell capacitors.

31. The method of forming a bit line over capacitor array of memory cells of claim 30 wherein the third layer of nitride and first layer of polysilicon are etched to define the isolated cell storage nodes without any prior patterning or masking of the second polyimide layer and first layer of polysilicon.

* * * * *